US012635233B2

(12) United States Patent
Chen et al.

(10) Patent No.: US 12,635,233 B2
(45) Date of Patent: May 19, 2026

(54) METHOD FOR FORMING SEMICONDUCTOR STRUCTURE

(71) Applicant: Taiwan Semiconductor Manufacturing Company, Ltd., Hsinchu (TW)

(72) Inventors: Hong-Chih Chen, Changhua County (TW); Fu-Hsiang Su, Zhubei city (TW); Yu-San Chien, Hsinchu city (TW); Shih-Hsun Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 474 days.

(21) Appl. No.: 18/312,828

(22) Filed: May 5, 2023

(65) Prior Publication Data

US 2024/0371873 A1    Nov. 7, 2024

(51) Int. Cl.
| | |
|---|---|
| *H10D 84/85* | (2025.01) |
| *H01L 21/28* | (2025.01) |
| *H10D 30/01* | (2025.01) |
| *H10D 30/43* | (2025.01) |
| *H10D 30/67* | (2025.01) |
| *H10D 62/10* | (2025.01) |

(Continued)

(52) U.S. Cl.
CPC ....... *H10D 84/85* (2025.01); *H01L 21/28123* (2013.01); *H10D 30/014* (2025.01); *H10D 30/43* (2025.01); *H10D 30/6735* (2025.01); *H10D 62/121* (2025.01); *H10D 64/017* (2025.01); *H10D 84/0167* (2025.01); *H10D 84/017* (2025.01); *H10D 84/0172* (2025.01); *H10D 84/0188* (2025.01); *H10D 84/038* (2025.01)

(58) Field of Classification Search
CPC ...... H10D 84/85; H10D 30/014; H10D 30/43; H10D 30/6735; H10D 62/121; H10D 64/017; H10D 84/0167; H10D 84/017; H10D 84/0172; H10D 84/0188; H10D 84/038; H01L 21/28123
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |

(Continued)

*Primary Examiner* — Jeff W Natalini
*Assistant Examiner* — Rose Keagy
(74) *Attorney, Agent, or Firm* — Birch, Stewart, Kolasch & Birch, LLP

(57) ABSTRACT

A method for forming a semiconductor structure is provided. The method includes forming a first active region, forming an interlayer dielectric layer over a source/drain region of the first active region, forming a gate stack to surround the channel region of the first active region, and etching the gate stack and the interlayer dielectric layer to form a cutting trench. The cutting trench includes a first portion extending into the gate stack and a second portion extending into the interlayer dielectric layer. A first width of the first portion of the cutting trench is different than a second width of the second portion of the cutting trench in a direction parallel to a longitudinal axis of the gate stack. The method also includes forming a gate cutting structure in the cutting trench.

20 Claims, 35 Drawing Sheets

(51) Int. Cl.
 H10D 64/01 (2025.01)
 H10D 84/01 (2026.01)
 H10D 84/03 (2025.01)

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,653,358 | B2 * | 5/2017 | Zhong ................ H10D 84/0128 |
| 11,545,490 | B2 * | 1/2023 | Ng .................... H01L 21/30604 |
| 2020/0303511 | A1 * | 9/2020 | Tsai ................... H10D 30/0323 |
| 2020/0343377 | A1 * | 10/2020 | Chiang .................. H10D 30/62 |
| 2021/0043499 | A1 * | 2/2021 | Tsai ................. H01L 21/76802 |
| 2022/0375920 | A1 * | 11/2022 | Xian ...................... H10D 89/10 |

* cited by examiner

METHOD FOR FORMING SEMICONDUCTOR STRUCTURE

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure, which can extend around the channel region and provide access to the channel on two or four sides. GAA devices are compatible with conventional complementary metal-oxide-semiconductor (CMOS) processes, and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2A-2 and 2A-3 are cross-sectional views of the semiconductor structure at an intermediate stage corresponding to line Y1-Y1, line Y2-Y2 and line X-X of FIG. 2A, in accordance with some embodiments of the disclosure.

FIGS. 2B-1, 2B-2 and 2B-3 are cross-sectional views of the semiconductor structure at an intermediate stage corresponding to line Y1-Y1, line Y2-Y2 and line X-X of FIG. 2A, in accordance with some embodiments of the disclosure.

FIGS. 2C-1, 2C-2 and 2C-3 are cross-sectional views of the semiconductor structure at an intermediate stage corresponding to line Y1-Y1, line Y2-Y2 and line X-X of FIG. 2A, in accordance with some embodiments of the disclosure.

FIGS. 2D-1, 2D-2 and 2D-3 are cross-sectional views of the semiconductor structure at an intermediate stage corresponding to line Y1-Y1, line Y2-Y2 and line X-X of FIG. 2D, in accordance with some embodiments of the disclosure.

FIGS. 2E-1, 2E-2, 2E-3 and 2E-4 are cross-sectional views of the semiconductor structure at an intermediate stage corresponding to line Y1-Y1, line Y2-Y2, line X-X and line Y3-Y3 of FIG. 2E, in accordance with some embodiments of the disclosure.

FIGS. 2F-1, 2F-2, 2F-3 and 2F-4 are cross-sectional views of the semiconductor structure at an intermediate stage corresponding to line Y1-Y1, line Y2-Y2, line X-X and line Y3-Y3 of FIG. 2E, in accordance with some embodiments of the disclosure.

FIGS. 2G-1, 2G-2, 2G-3 and 2G-4 are cross-sectional views of the semiconductor structure at an intermediate stage corresponding to line Y1-Y1, line Y2-Y2, line X-X and line Y3-Y3 of FIG. 2G, in accordance with some embodiments of the disclosure.

FIGS. 2H-1, 2H-2, 2H-3 and 2H-4 are cross-sectional views of the semiconductor structure at an intermediate stage corresponding to line Y1-Y1, line Y2-Y2, line X-X and line Y3-Y3 of FIG. 2H, in accordance with some embodiments of the disclosure.

FIG. 2H-5 is an enlarged plan view of the semiconductor structure, in accordance with some embodiments of the disclosure.

FIGS. 2I-1, 2I-2, 2I-3 and 2I-4 are cross-sectional views of the semiconductor structure at an intermediate stage corresponding to line Y1-Y1, line Y2-Y2, line X-X and line Y3-Y3 of FIG. 2I, in accordance with some embodiments of the disclosure.

FIG. 2I-5 is a perspective view of a semiconductor structure of FIG. 2I, in accordance with some embodiments of the disclosure.

FIG. 2I-6 is an enlarged plan view of the semiconductor structure, in accordance with some embodiments of the disclosure.

FIGS. 2J-1, 2J-2, 2J-3 and 2J-4 are cross-sectional views of the semiconductor structure at an intermediate stage corresponding to line Y1-Y1, line Y2-Y2, line X-X and line Y3-Y3 of FIG. 2I, in accordance with some embodiments of the disclosure.

FIG. 2J-5 is an enlarged plan view of the semiconductor structure, in accordance with some embodiments of the disclosure.

FIG. 3 is a modification of the semiconductor structure of FIG. 2J-5, in accordance with some embodiments of the disclosure.

FIG. 4 is a modification of the semiconductor structure of FIG. 2J-5, in accordance with some embodiments of the disclosure.

FIG. 5 is a plan view illustrating the formation of a semiconductor structure at various intermediate stages, in accordance with some embodiments of the disclosure.

FIG. 6 is a plan view illustrating the formation of a semiconductor structure at various intermediate stages, in accordance with some embodiments of the disclosure.

DETAILED DESCRIPTION

Figure 1:
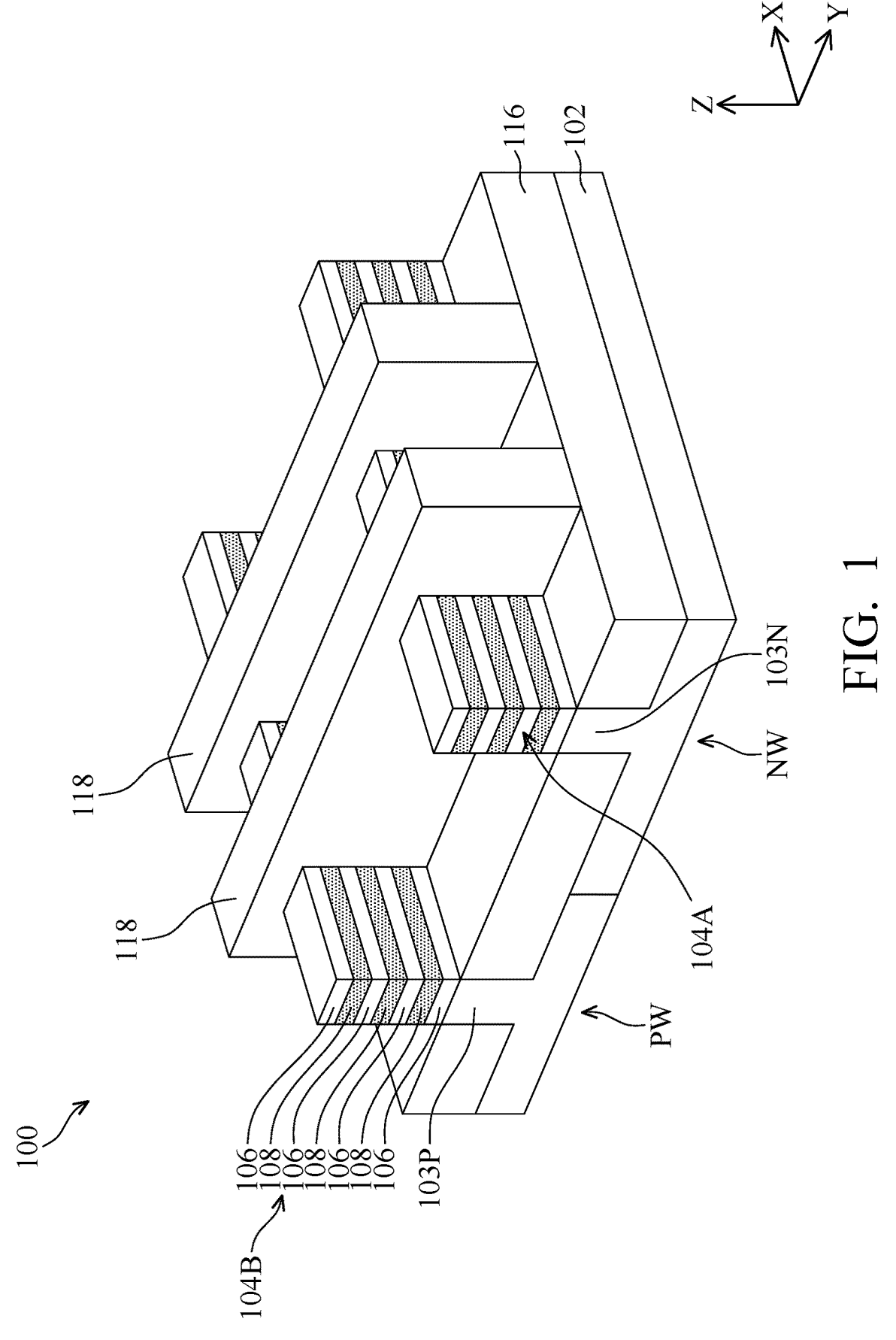
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The nanostructure transistor (e.g., gate all around (GAA) transistor, fork-sheet transistor, etc) structures described below may be patterned using any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure transistor structure.

Embodiments of a semiconductor structure and a method for forming the semiconductor structure are provided. The aspect of the present disclosure is directed to a semiconductor structure including a gate cutting structure. The semiconductor structure may include a gate cutting structure in the gate stack and the first interlayer dielectric layer. The distance between the active region and the portion of the gate cutting structure in the gate stack is less than the distance between the active region and the portion of the gate cutting structure in the first interlayer dielectric layer. Therefore, the risk of damage to the source/drain features in the etching process for forming the gate cutting structure may reduce, while the parasitic capacitance between the gate stack and the contact plug may reduce. Therefore, the performance and the manufacturing yield of the resulting semiconductor device may increase.

FIG. 1 is a perspective view of a semiconductor structure 100, in accordance with some embodiments of the disclosure.

The semiconductor structure 100 includes a substrate 102 and fin structures 104A and 104B over the substrate 102, as shown in FIG. 1, in accordance with some embodiments. The substrate 102 includes a p-type well PW and an n-type well NW immediately adjacent to the p-type well PW, in accordance with some embodiments. The fin structure 104A is formed in the n-type well NW of the substrate 102, and the fin structure 104B is formed in the p-type well PW of the substrate 102, in accordance with some embodiments. The fin structures 104A and 104B are the active regions of the semiconductor structure 100, in accordance with some embodiments.

For a better understanding of the semiconductor structure 100, the X-Y-Z coordinate reference is provided in the figures of the present disclosure. The X-axis and the Y-axis are generally orientated along the lateral (or horizontal)

directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

The fin structure 104A includes a lower fin element 103N formed from the n-type well NW, and the fin structure 104B includes a lower fin element 103P formed from the p-type well PW, in accordance with some embodiments. The lower fin elements 103P and 103N are surrounded by an isolation structure 116, in accordance with some embodiments. Each of the fin structures 104A and 104B further includes an upper fin element formed from an epitaxial stack including alternating first semiconductor layers 106 and second semiconductor layer 108, in accordance with some embodiments. The second semiconductor layers 108 will form nanostructures (e.g., nanowires or nanosheets) and serve as the channel for the resulting semiconductor devices, in accordance with some embodiments.

The fin structures 104A and 104B extend in the X direction, in accordance with some embodiments. That is, the fin structures 104A and 104B have longitudinal axes parallel to the X direction, in accordance with some embodiments. The X direction may also be referred to as the channel-extending direction. The current of the resulting semiconductor devices (e.g., nanostructure transistors) flows in the X direction through the channel. Each of the fin structures 104A and 104B is defined as several channel regions and several source/drain regions, where the channel regions and the source/drain regions are alternately arranged, in accordance with some embodiments. In this disclosure, a source/drain refers to a source and/or a drain. It is noted that in the present disclosure, a source and a drain are interchangeably used and the structures thereof are substantially the same.

Gate structures 118 are formed with longitudinal axes parallel to the Y direction and extending across and/or surrounding the channel regions of the fin structures 104A and 104B, in accordance with some embodiments. The source/drain regions of the fin structures 104A and 104B are exposed from the gate structures 118, in accordance with some embodiments. The Y direction may also be referred to as a gate-extending direction.

Although two fin structures 104A and 104B are illustrated in FIG. 1, the semiconductor structure 100 may include more than two fin structures 104. In addition, FIG. 1 shows two gate structures 118 (or channel regions) for illustrative purposes and is not intended to be limiting. The number of fin structures and the gate structures may be dependent on design demand of an integrated circuit and/or performance consideration of semiconductor devices.

FIGS. 2A through 2J-5 are schematic views illustrating the formation of a semiconductor structure 100 at various intermediate stages, in accordance with some embodiments of the disclosure.

Figure 2A:
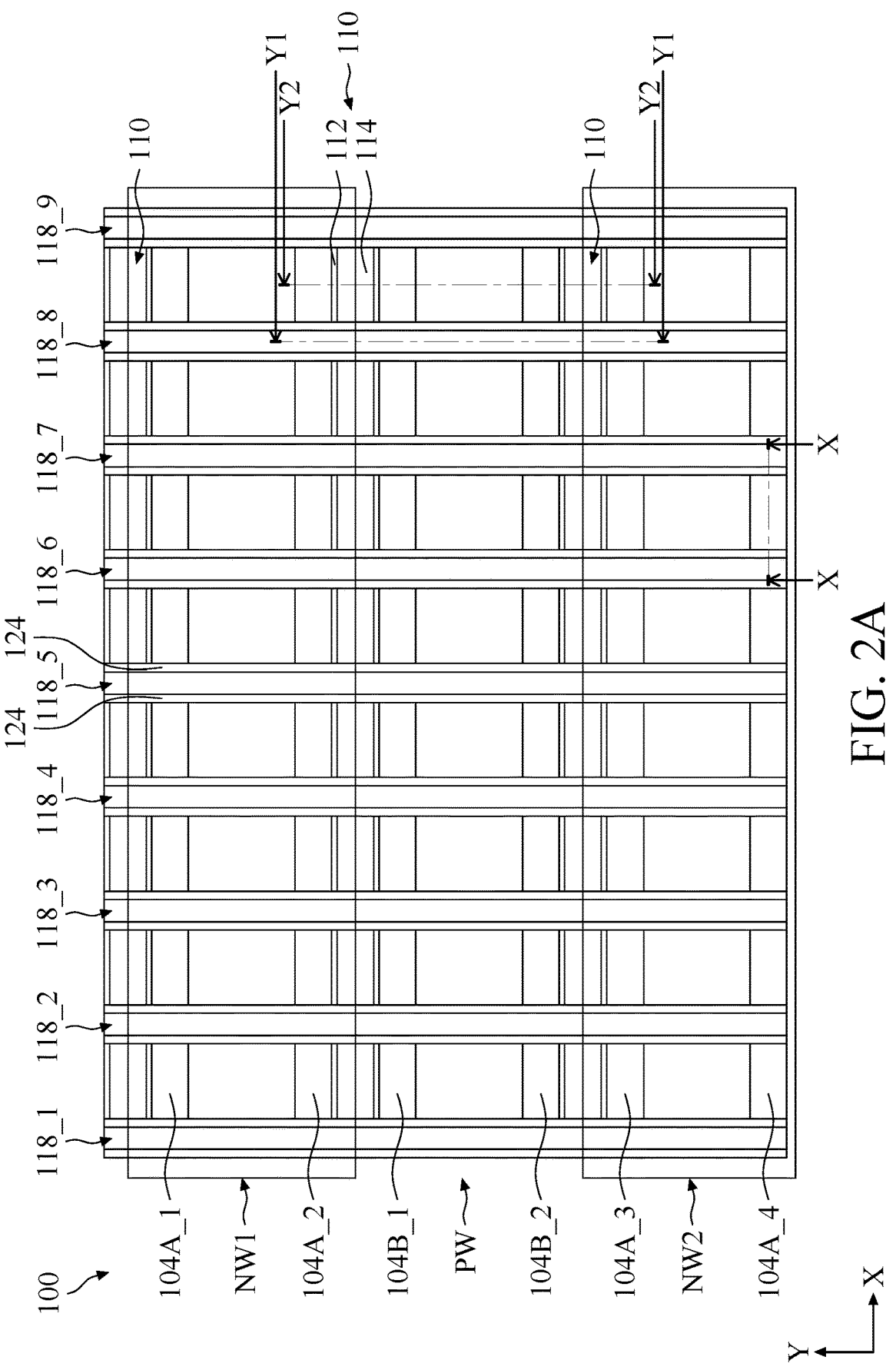
FIGS. 2A, 2D, 2E, 2G, 2H and 2I are plan views illustrating the formation of a semiconductor structure at various intermediate stages, in accordance with some embodiments of the disclosure.
Figures 1, 2, 2A:
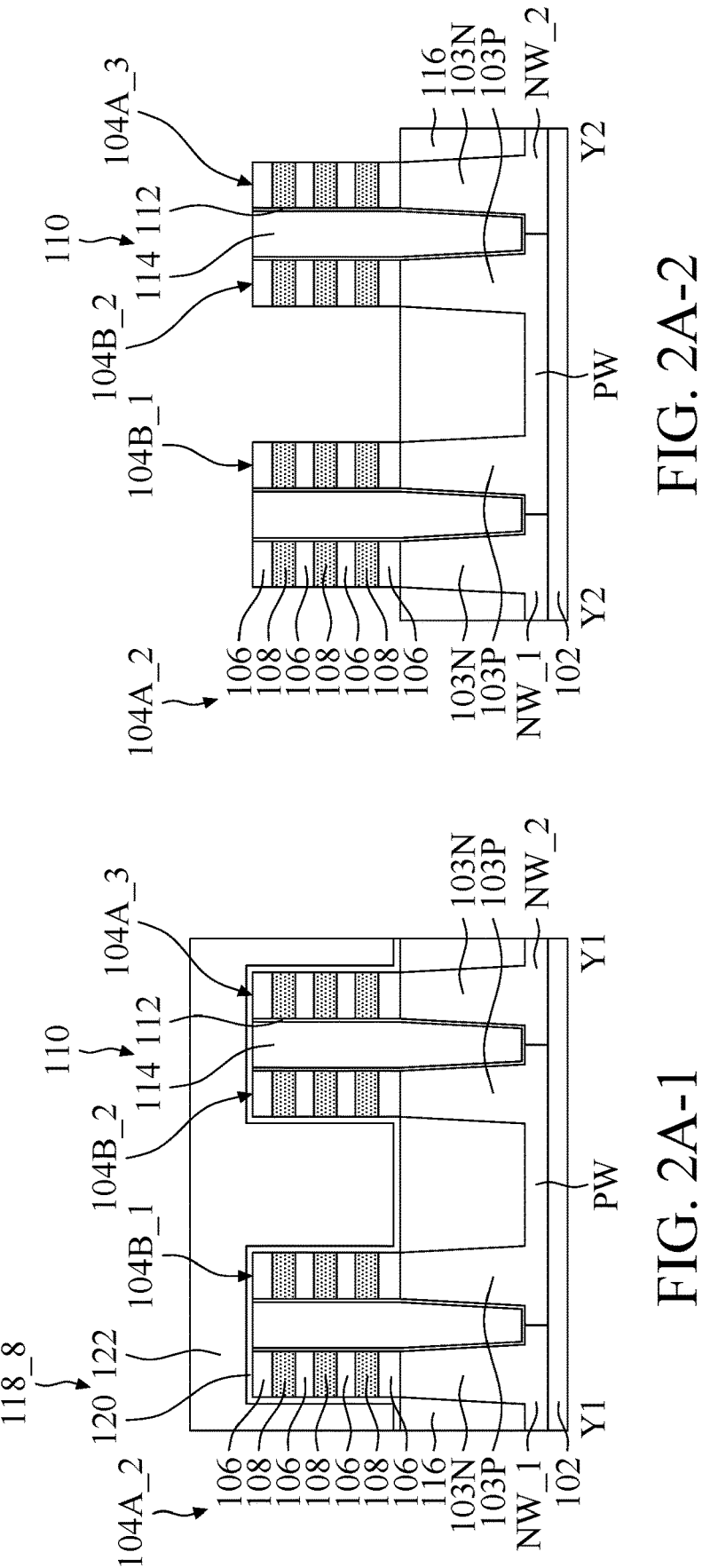
Figures 2, 2A, 3:
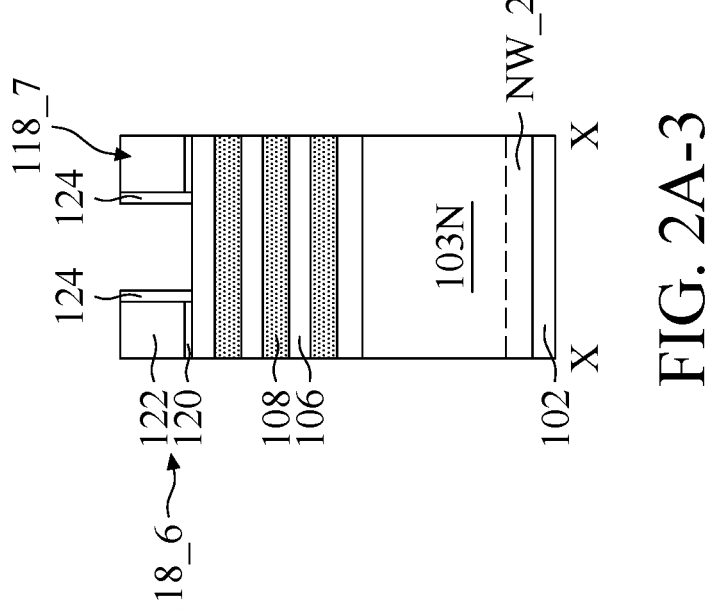

FIGS. 2A through 2A-3 illustrate a semiconductor structure 100 after the formation of active regions 104, dielectric walls 110, an isolation structure 116, dummy gate structures 118 and gate spacer layers 124. FIG. 2A is a plan view of the semiconductor structure 100. FIGS. 2A-1, 2A-2 and 2A-3 are cross-sectional views corresponding to line Y1-Y1, line Y2-Y2 and line X-X of FIG. 2A. It should be noted that the plan views in the present disclosure only illustrate some components of the semiconductor structure 100 for illustrative purposes, some other components of the semiconductor structure 100 may be shown in the cross-sectional views.

The semiconductor structure 100 includes a substrate 102 and a plurality of active regions 104A (including 104A_1 to 104A_4) and 104B (including 104B_1 and 104B_2) over the substrate 102, as shown in FIGS. 2A to 2A-3, in accordance with some embodiments. The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

N-type wells NW1 and NW2 and p-type well PW are formed in the substrate 102 using ion implantation processes, as shown in FIGS. 2A to 2A-3, in accordance with some embodiments. The p-type well PW is located between the n-type wells NW1 and NW2, in accordance with some embodiments. In some embodiments, the respective concentrations of the dopants in the n-type wells NW1 and NW2 and the p-type PW are in a range from about $10^{16}/cm^{-3}$ to about $10^{18}/cm^{-3}$. In some embodiments, the ion implantation processes may be performed several times with different dosages and different energy intensities. In some embodiments, the ion implantation process may include anti-punch through (APT) implant.

The active regions 104A_1 and 104_2 are formed over the n-type well NW1 of the substrate 102, the active regions 104B_1 and 104B_2 are formed over the p-type well PW of the substrate 102, and the active regions 104A_3 and 104_4 are formed over the n-type well NW2 of the substrate 102, in accordance with some embodiments. In some embodiments, the active regions 104A and 104B are the fin structures 104A and 104B as shown in FIG. 1. Although FIG. 2A illustrates two active regions 104 in a well NW1, NW2 or PW, the number of the active regions in a well may be dependent on the demands on the design of the semiconductor device and/or performance considerations.

In some embodiments, the active regions 104A and 104B extend in the X direction. That is, the dimensions (lengths) of the active regions 104A and 104B in the X direction are greater than the dimensions (widths) of the active regions 104A and 104B in the Y direction.

The formation of the active regions 104A and 104B includes forming an epitaxial stack over the substrate 102 using an epitaxial growth process, in accordance with some embodiments. The epitaxial stack includes alternating first semiconductor layers 106 and second semiconductor layers 108, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the first semiconductor layers 106 are made of a first semiconductor material and the second semiconductor layers 108 are made of a second semiconductor material. The first semiconductor material for the first semiconductor layers 106 has a different lattice constant than the second semiconductor material for the second semiconductor layers 108, in accordance with some embodiments. In some embodiments, the first semiconductor material and the second semiconductor material have different oxidation rates and/or etching selectivity. In some embodiments, the first semiconductor layers 106 are made of SiGe, where the percentage of germanium (Ge) in the SiGe is in a range from about 20 atomic % to about 50 atomic %, and the second semiconductor layers 108 are made of pure or substantially pure silicon. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

The first semiconductor layers 106 are configured as sacrificial layers and will be removed to form gaps to accommodate gate materials, and the second semiconductor layers 108 will form nanostructures (e.g., nanowires or nanosheets) that laterally extend between source/drain features and serve as the channel for the resulting semiconductor device (such as nanostructure transistors), in accordance with some embodiments. Although four first semiconductor layers 106 and three second semiconductor layers 108 are shown in FIG. 1A, the numbers are not limited thereto. By adjusting the number of the semiconductor layers, the driving current of the resulting nanostructure device can be adjusted.

The formation of the active regions 104A and 104B further includes patterning the epitaxial stack and underlying wells NW1, NW2 and PW using photolithography and etching processes, thereby forming trenches and the active regions 104A and 104B protruding from between trenches, in accordance with some embodiments.

The portion of the n-type wells NW1 and NW2 protruding from between the trenches serves as lower fin elements 103N of the active regions 104A, and the portion of the p-type wells PW protruding from between the trenches serves as lower fin elements 103P of the active regions 104B, as shown in FIG. 2A-1 to 2A-3, in accordance with some embodiments. The lower fin elements 103N of the active regions 104A have a different electrically conductive type than the lower fin elements 103P of the active regions 104B, in accordance with some embodiments. A remainder of the epitaxial stack (including the first semiconductor layers 106 and the second semiconductor layers 108) serves as the upper fin elements of the active regions 104A and 104B, in accordance with some embodiments.

In some embodiments, the trenches between the active regions 104 are divided into a group of wider trenches and a group of narrower trenches. In some embodiments, the wider trenches are located within the wells NW1, NW2 and PW, and the narrower trenches are located on the boundaries between the n-type wells NW1 and NW2 and the p-type well PW. In some embodiments, the wider trenches are wider than the narrower trenches in the Y direction. In some embodiments, the wider trenches and the narrower trenches are arranged alternatingly in the Y direction.

Dielectric walls 110 are formed in the narrower trenches on the boundaries between the n-type wells NW1 and NW2 and the p-type well PW, as shown in FIGS. 2A, 2A-1 and 2A-2, in accordance with some embodiments. The dielectric walls 110 abuts and are in direct contact with the sidewalls of the active regions 104A and 104B, in accordance with some embodiments. In some embodiments, the dielectric walls 110 extend in the X direction. That is, the dielectric walls 110 have longitudinal axes parallel to the X direction, in accordance with some embodiments. In some embodiments, each of the dielectric walls 110 includes a lining layer 112 lining on the sidewalls of the active regions 104A and 104B and the upper surface of the substrate 102, and a dielectric bulk layer 114 nested within the lining layer 112.

In some embodiments, the lining layer 112 and the dielectric bulk layer 114 are made of dielectric material such as silicon oxide (SiO$_2$), silicon nitride (SiN), silicon oxynitride (SiON), silicon carbon nitride (SiCN), silicon oxycarbonitride (SiOCN), oxygen-doped silicon carbide (SiC:O), and/or oxygen-doped silicon carbonitride (Si(O)CN). In some embodiments, the lining layer 112 and the dielectric bulk layer 114 are made of different materials. For example, the dielectric bulk layer 114 is made of SiN and the lining layer 112 is made of SiO, SiON, SiCN or SiOCN.

The formation of the dielectric walls 110 includes depositing dielectric materials for the lining layer 112 and the dielectric bulk layer 114 to partially fill the wider trenches and overfill the narrower trenches, and then etching away the dielectric materials from the wider trenches, in accordance with some embodiments. The dielectric materials remaining in the narrower trenches serve as dielectric walls 110, in accordance with some embodiments. In some embodiments, the deposition process includes atomic layer deposition (ALD), CVD (such as flowable CVD (FCVD), low-pressure CVD (LPCVD), plasma-enhanced CVD (PECVD), high density plasma CVD (HDP-CVD), or high aspect ratio process (HARP)), another suitable technique, or a combination thereof. In some embodiments, the etching back process includes an anisotropic etching process such as dry plasma etching, an isotropic etching process such as dry chemical etching, remote plasma etching or wet chemical etching, or a combination thereof.

An isolation structure 116 is formed in the wider trenches within the wells NW1, NW2 and PW, as shown in FIGS. 2A-1 and 2A-2, in accordance with some embodiments. The bottom surface of the isolation structure 116 is illustrated as a dashed line in FIG. 2A-3. The isolation structure 116 and lower portions of the dielectric walls 110 are configured to electrically isolate active regions 104A and 104B of the semiconductor structure 100, and the isolation structure 116 is also referred to as shallow trench isolation (STI) feature, in accordance with some embodiments.

The formation of the isolation structure 116 includes forming an insulating material to overfill the wider trenches, in accordance with some embodiments. In some embodiments, the insulating material is made of silicon oxide (SiO$_2$), silicon nitride (SiN), silicon oxynitride (SiON), silicon carbide (SiC), oxygen-doped silicon carbide (SiC:O), oxygen-doped silicon carbonitride (Si(O)CN), or a combination thereof. In some embodiments, the insulating material is deposited using CVD (such as FCVD, LPCVD, PECVD, HDP-CVD, or HARP), ALD, another suitable technique, or a combination thereof.

A planarization process is performed on the insulating material to remove a portion of the insulating material above the active regions 104A and 104B and the dielectric walls 110, in accordance with some embodiments. The planarization may be chemical mechanical polishing (CMP), etching back process, or a combination thereof. The insulating material is then recessed by an etching process (such as dry plasma etching and/or wet chemical etching) until the sidewalls of the upper fin elements of the active regions 104A and 104B are exposed, in accordance with some embodiments. The remaining insulating material serves as the isolation structure 116, in accordance with some embodiments.

Dummy gate structures 118 (including 118_1 to 118_9) are formed across the channel regions of the active regions 104A and 104B, the dielectric walls 110 and the isolation structure 116, as shown in FIGS. 2A, 2A-1 and 2A-3, in accordance with some embodiments. The dummy gate structures 118 cover the top surface and one sidewall of each of the active regions 104A and 104B, in accordance with some embodiments. The other sidewall of each of the active regions 104A and 104B is entirely covered by the dielectric wall 110, in accordance with some embodiments.

In some embodiments, the dummy gate structures 118 extend in the Y direction. That is, the dummy gate structures 118 have longitudinal axes parallel to the Y direction, in accordance with some embodiments. That is, the dimensions (lengths) of the dummy gate structures 118 in the Y direction are greater than the dimensions (widths) of the dummy gate structures 118 in the X direction. The dummy gate structures 118 are configured as sacrificial structures to define the footprint of final gate stacks, in accordance with some embodiments.

Each of the dummy gate structures 118 includes a dummy gate dielectric layer 120 and a dummy gate electrode layer 122 formed over the dummy gate dielectric layer 120, as shown in FIGS. 2A-1 and 2A-3, in accordance with some embodiments. A dummy gate dielectric layer 120 is conformally formed along the semiconductor structure 100, in accordance with some embodiments. In some embodiments, the dummy gate dielectric layer 120 is made of one or more dielectric materials, such as silicon oxide (SiO), silicon nitride (SiN), silicon oxynitride (SiON), HfO$_2$, HfZrO, HfSiO, HfTiO, HfAlO, or a combination thereof. In some embodiments, the dielectric material is formed using ALD, CVD, thermal oxidation, physical vapor deposition (PVD), another suitable technique, or a combination thereof.

In some embodiments, the dummy gate electrode layer 122 is made of semiconductor material such as polysilicon or poly-silicon germanium. In some embodiments, the material for the dummy gate electrode layer 122 is deposited using CVD, ALD, another suitable technique, or a combination thereof. In some embodiments, the formation of the dummy gate structures 118 includes globally and conformally depositing a dielectric material for the dummy gate dielectric layer 118 over the semiconductor structure 100, depositing a material for the dummy gate electrode layer 122 over the dielectric material, planarizing the material for the dummy gate electrode layer 122, and patterning the material for the dummy gate electrode layer 122 and the dielectric material into the dummy gate structures 118 using photolithography and etching processes.

Gate spacer layers 124 are formed along the opposite sidewalls of the dummy gate structures 120, as shown in FIGS. 2A and 2A-3, in accordance with some embodiments. The gate spacer layers 124 extend in the Y direction and across the active regions 104A and 104B, the dielectric walls 110 and the isolation structure 116, in accordance with some embodiments. The gate spacer layers 124 are used to offset the subsequently formed source/drain features and separate the source/drain features from the gate structure, in accordance with some embodiments.

In some embodiments, the gate spacer layers 124 are made of dielectric material, such as silicon oxide (SiO$_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the gate spacer layers 124 are made of low-k dielectric materials. For example, the dielectric constant (k) value of the gate spacer layers 124 may be lower than a k-value of silicon oxide (SiO), such as lower than 4.2, equal to or lower than about 3.9, such as in a range from about 3.5 to about 3.9.

In some embodiments, the formation of the gate spacer layers 124 includes globally and conformally depositing a dielectric material for the gate spacer layers 124 over the semiconductor structure 100, followed by an anisotropic etching process. In some embodiments, the etching process is performed without an additional photolithography process. The portions of the dielectric material that remain on the sidewalls of the dummy gate structures 118 serve as the gate spacer layers 124, in accordance with some embodiments.

FIGS. 2B-1 through 2B-3 illustrate a semiconductor structure 100 after the formation of source/drain recesses 126 and inner spacer layers 128. FIGS. 2B-1, 2B-2 and 2B-3 are cross-sectional views corresponding to line Y1-Y1, line Y2-Y2 and line X-X of FIG. 2A.

Figures 1, 2, 2B:
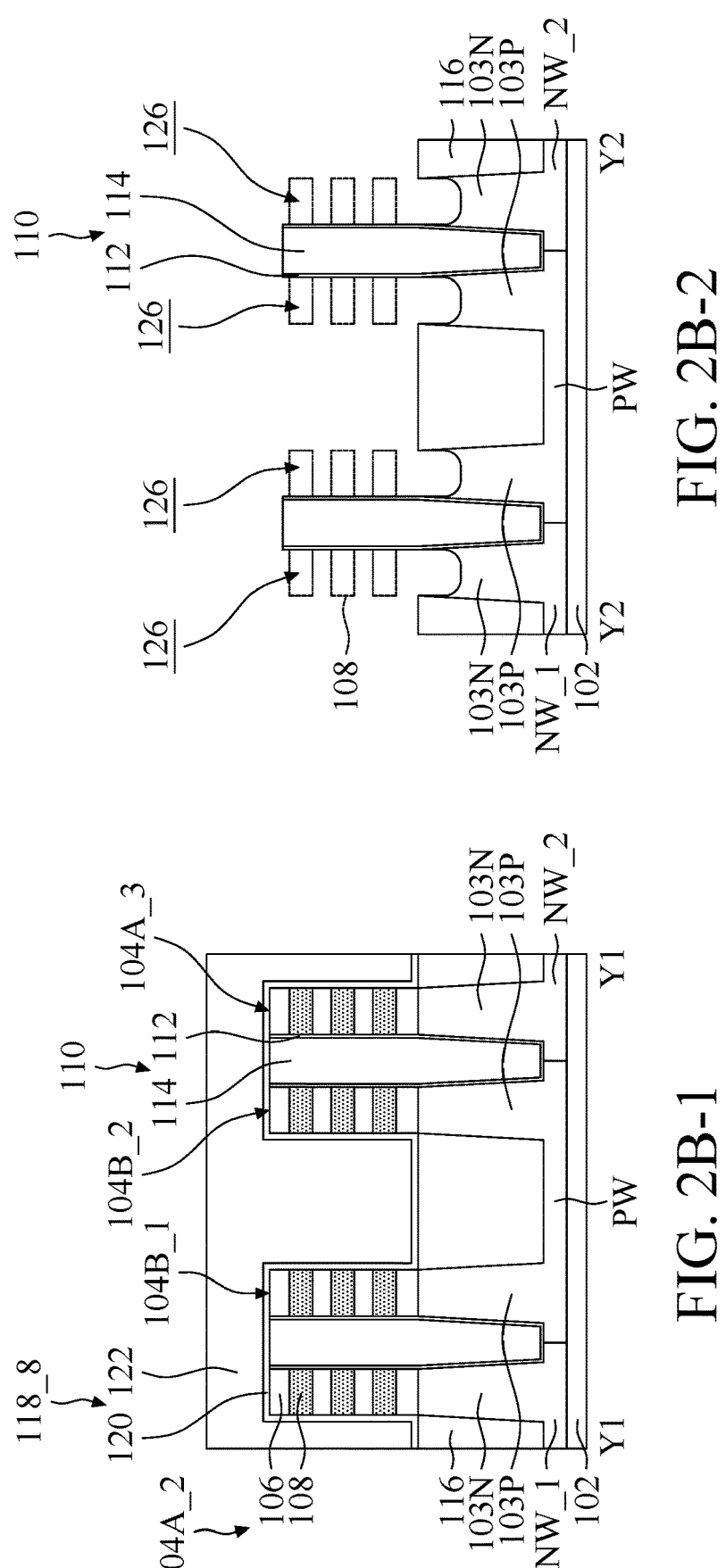
Figures 2, 2B, 3:
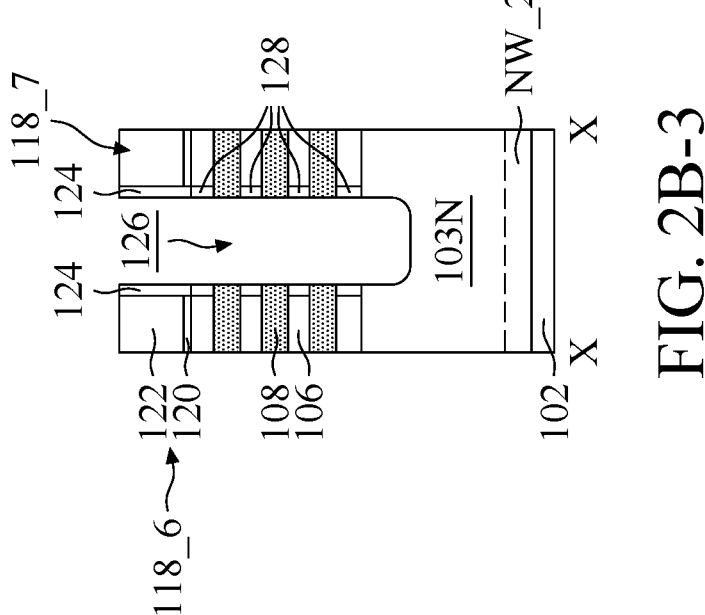

An etching process is performed to recess the source/drain regions of the active regions 104A and 104B, thereby forming source/drain recesses 126 in the active regions 104A and 104B, as shown in FIGS. 2B-2 and 2B-3, in accordance with some embodiments. The second semiconductor layers 108 are illustrated as dashed lines in FIGS. 2B-2. The etching process may be an anisotropic etching process such as dry plasma etching, an isotropic etching process such as dry chemical etching, remote plasma etching or wet chemical etching, or a combination thereof. The gate spacer layers 124 and the dummy gate structures 118 may serve as etch masks so that the source/drain recesses 126 may be formed self-aligned on opposite sides of the dummy gate structures 118, in accordance with some embodiments.

The source/drain recesses 126 extend into the lower fin elements 103N and 103P, in accordance with some embodiments. In the etching process, the portion of the dielectric walls 110 uncovered by the gate spacer layers 124 and the dummy gate structures 118 is also recessed, in accordance with some embodiments.

Afterward, an isotropic etching process is performed to laterally recess, from the source/drain recesses 126 toward the channel region, the first semiconductor layers 106 of the active regions 104A and 104B to form notches, and inner spacer layers 128 are formed in the notches, as shown in FIG. 2B-3, in accordance with some embodiments. In some embodiments, the isotropic etching process may be dry chemical etching, remote plasma etching, wet chemical etching, another suitable technique, or a combination thereof.

The inner spacer layers 128 are formed to abut the exposed sidewalls of the first semiconductor layers 106, in accordance with some embodiments. In some embodiments, the inner spacer layers 128 are formed directly below the gate spacer layers 124, in accordance with some embodiments. In some embodiments, the inner spacer layers 128 are located between adjacent second semiconductor layers 108, between the uppermost second semiconductor layer 108 and the gate spacer layers 124, and between the lowermost second semiconductor layer 108 and the lower fin element 103P (or 103N).

The inner spacer layers 128 interpose subsequently formed source/drain features and gate stack to avoid the source/drain features and the gate stack from being in direct contact and are configured to reduce the parasitic capacitance between the gate stack and the source/drain features (i.e., Cgs and Cgd), in accordance with some embodiments. In some embodiments, the inner spacer layers 128 are made of a silicon-containing dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the inner spacer layers 128 are made of low-k dielectric materials. For example, the dielectric constant of the inner spacer layers 128 may be lower than a k-value of silicon oxide (SiO), such as lower than 4.2, equal to or lower than about 3.9, such as in a range of about 3.5 to about 3.9.

The formation of the inner spacer layers 128 includes depositing a dielectric material for the inner spacer layers 128 over the semiconductor structure 100 to overfill the notches, and then etching back the dielectric material to remove the dielectric material outside the notches. Portions of the dielectric material left in the notches serve as inner spacer layers 128, in accordance with some embodiments. In some embodiments, the deposition process includes ALD, CVD (such as PECVD, LPCVD or HARP), another suitable technique, or a combination thereof. In some embodiments, the etching back process includes an anisotropic etching process such as dry plasma etching, an isotropic etching process such as dry chemical etching, remote plasma etching or wet chemical etching, or a combination thereof.

FIGS. 2C-1 through 2C-3 illustrate a semiconductor structure 100 after the formation of source/drains 128. FIGS. 2C-1, 2C-2 and 2C-3 are cross-sectional views corresponding to line Y1-Y1, line Y2-Y2 and line X-X of FIG. 2A.

Figures 1, 2, 2C:
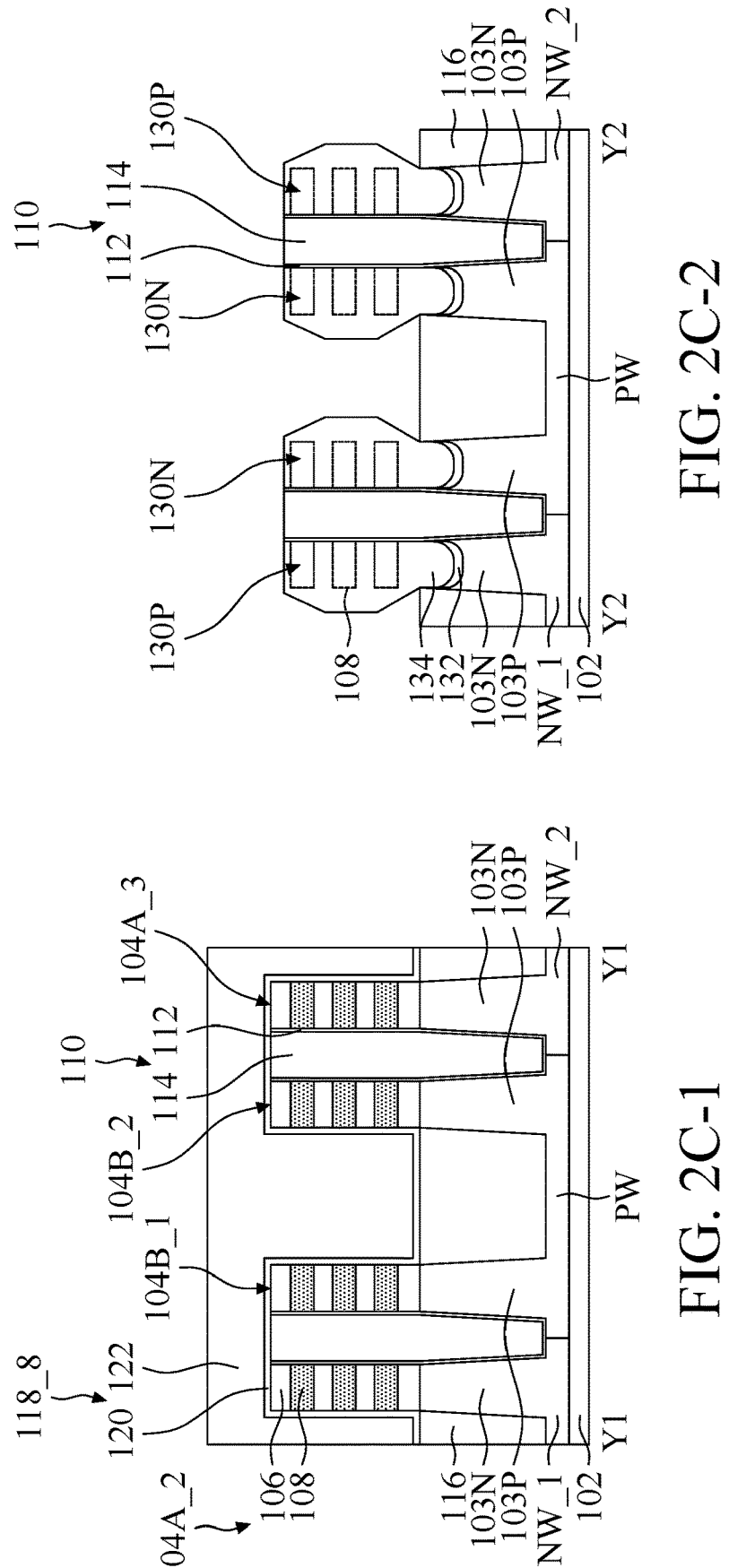
Figures 2, 2C, 3:
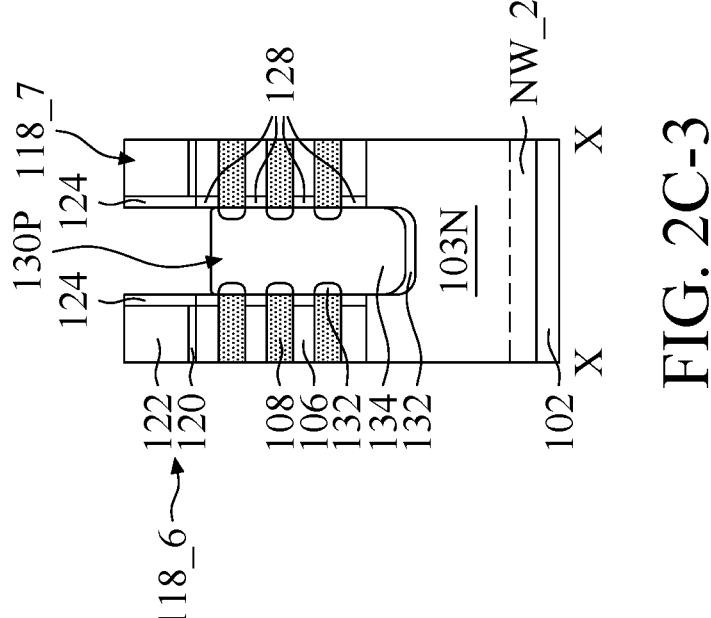

Source/drain features 130 (including 130N and 130P) are formed in the source/drain recesses 126 using an epitaxial growth process, as shown in FIGS. 2C-2 and 2C-3, in accordance with some embodiments. The source/drain features 130N are formed on the lower fin elements 103P of the active regions 104B in the p-type well PW, and the source/drain features 130P are formed on the lower fin elements 103N of the active regions 104A in the n-type wells NW1 and NW2, in accordance with some embodiments. The source/drain features 130 are formed on opposite sides of the dummy gate structures 118, in accordance with some embodiments. The epitaxial growth process may be MBE, MOCVD, or VPE, another suitable technique, or a combination thereof.

In some embodiments, the source/drain features 130N have a different electrically conductive type than the source/drain features 130P. In some embodiments, the source/drain features 130N and the source/drain features 130P may be formed separately. In some embodiments, the source/drain features 130N and 130P are in-situ doped during the epitaxial processes.

Each of the source/drain features 130N and 130P includes barrier layers 132 formed on lower fin elements 103N and 103P and on the second semiconductor layers 108, and a bulk layer 134 filling the remainder of the source/drain recess 126, in accordance with some embodiments. In some embodiments, the barrier layers 132 and the bulk layer 134 are doped. The concentration of the dopant in the bulk layer 134 is higher than the concentration of the dopant in the barrier layers 132, e.g., by 2 orders, in accordance with some embodiments. In alternative embodiments, an undoped semiconductor layer (e.g., intrinsic silicon) may be formed on the lower fin elements 103N and 103P before forming the source/drain features 130N and 130P, and are configured as insulating layers to reduce leakage between adjacent devices from through the substrate 102.

In some embodiments, the source/drain features 130N are doped with the n-type dopant during the epitaxial growth process. For example, the n-type dopant may be phosphorous (P) or arsenic (As). For example, the n-type source/drain features 130N may be the epitaxially grown silicon phosphorous (SiP), silicon carbon (SIC), silicon phosphorous carbon (SiPC), silicon phosphorous arsenic (SiPAs), silicon arsenic (SiAs), silicon (Si) or a combination thereof doped with phosphorous and/or arsenic. In some embodiments, the concentrations of the dopant (e.g., P) in the source/drain features 130N are in a range from about $2\times10^{19}$ $cm^{-3}$ to about $3\times10^{21}$ $cm^{-3}$.

In some embodiments, the source/drain features 130P are doped with the p-type dopant during the epitaxial growth process. For example, the p-type dopant may be boron (B) or $BF_2$. For example, the p-type source/drain features 130P may be the epitaxially grown silicon germanium (SiGe), silicon germanium carbon (SiGeC), germanium (Ge), silicon (Si) or a combination thereof doped with boron (B). In some embodiments, the concentrations of the dopant (e.g., B) in the source/drain features 130P are in a range from about $1\times10^{19}$ $cm^{-3}$ to about $6\times10^{20}$ $cm^{-3}$.

The source/drain features 130N and 130P are formed to abut the dielectric walls 110, in accordance with some embodiments. The dielectric walls 110 may prevent the adjacent source/drain features 130N and 130P from merging, in accordance with some embodiments.

Figure 2D:
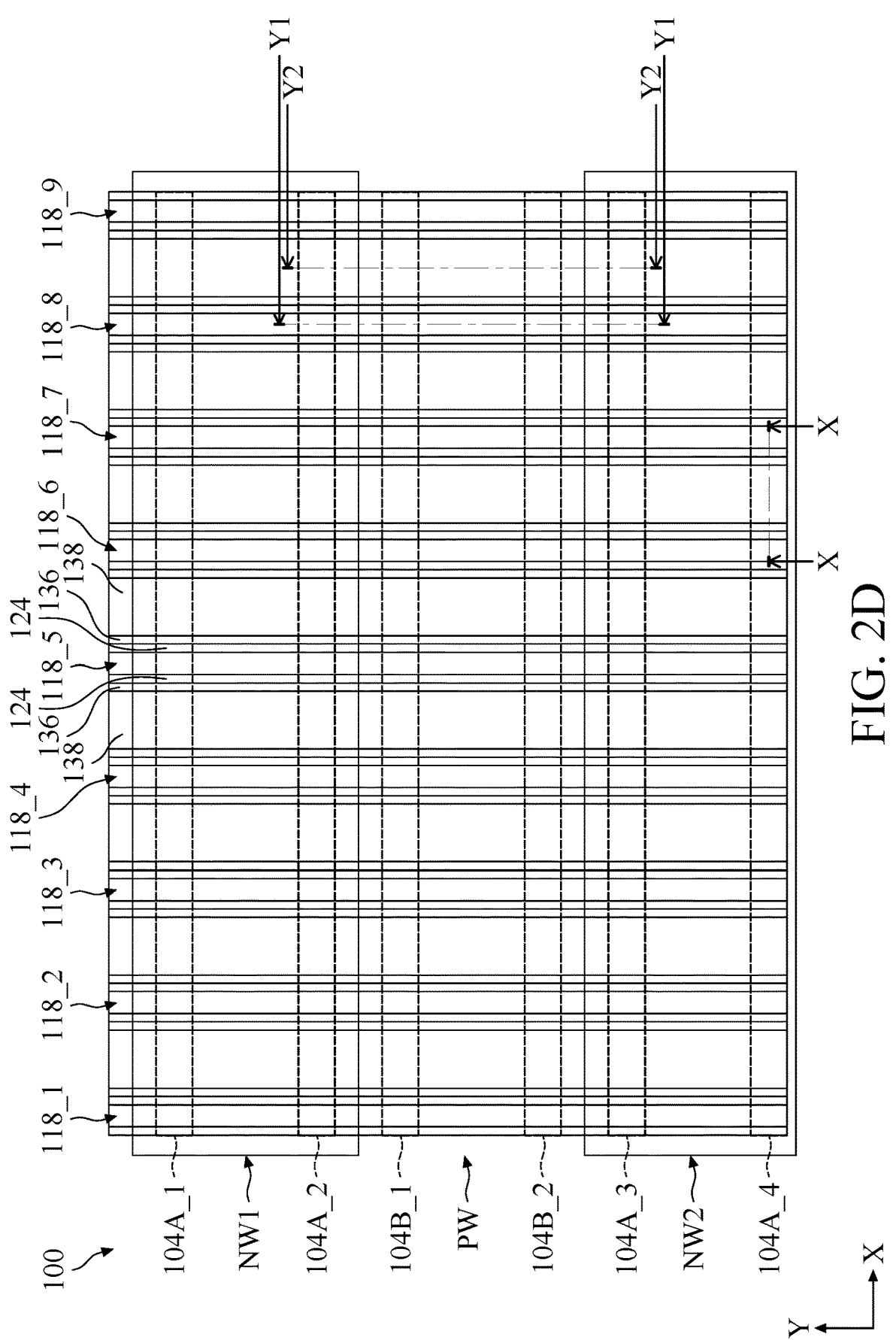
Figures 1, 2, 2D:
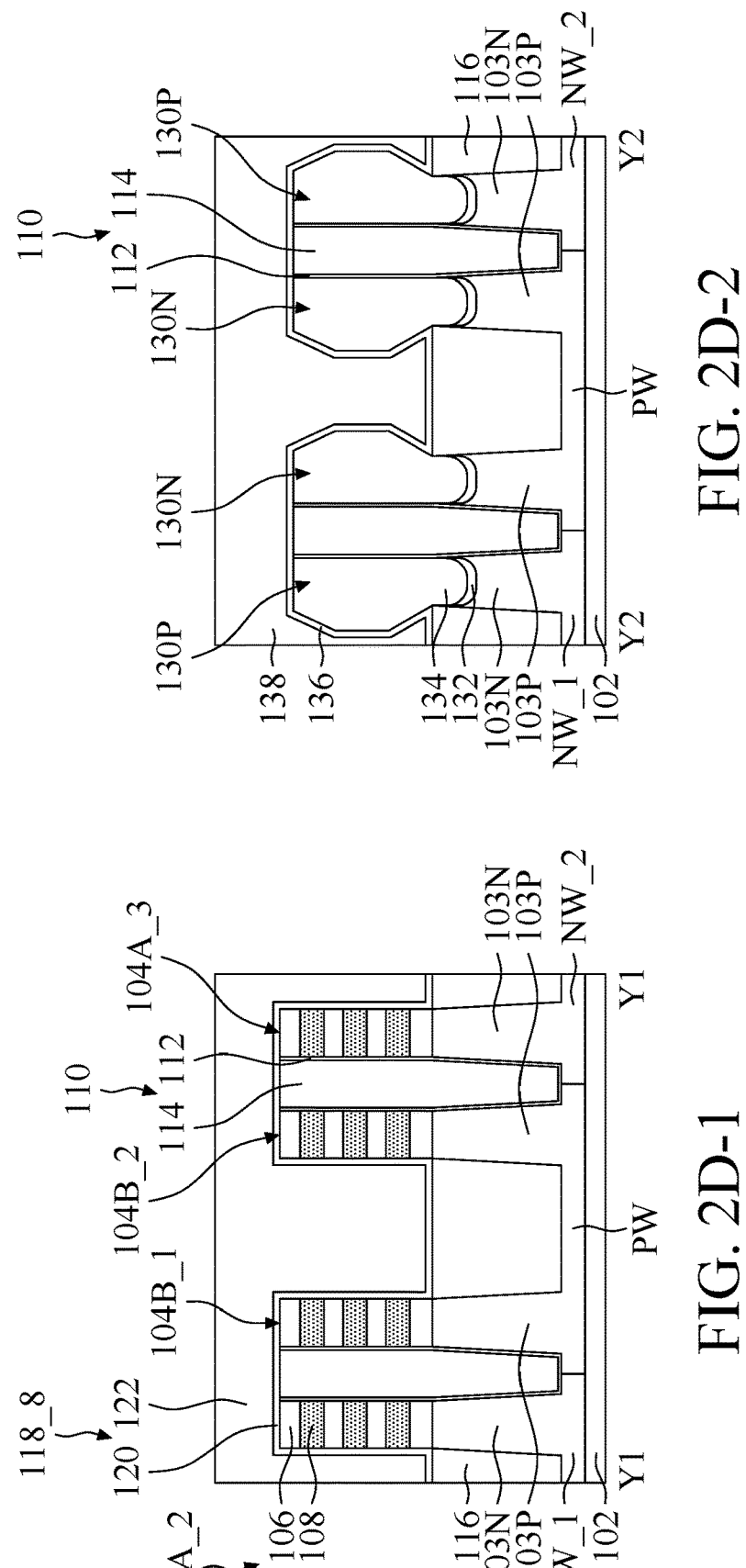
Figures 2, 2D, 3:
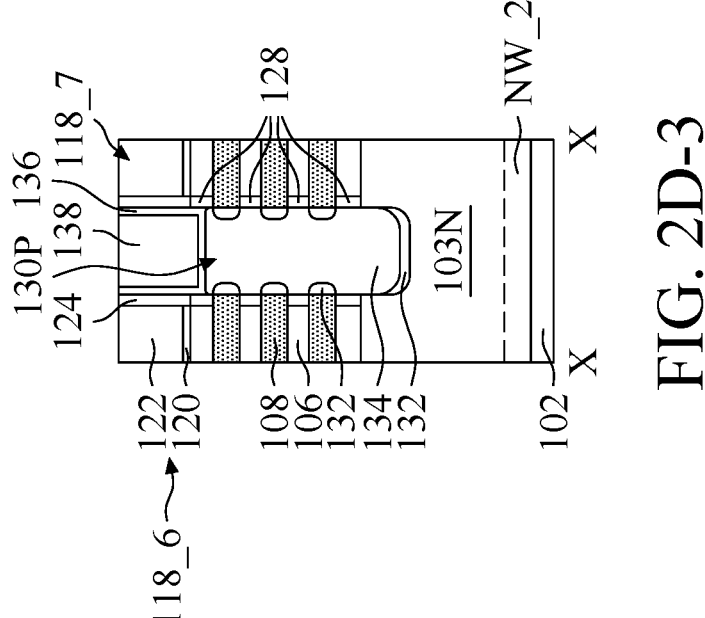

FIGS. 2D through 2D-3 illustrate a semiconductor structure 100 after the formation of a contact etching stop layer (CESL) 136 and a first interlayer dielectric layer (ILD) 138. FIG. 2D is a plan view of the semiconductor structure 100. FIGS. 2D-1, 2D-2 and 2D-3 are cross-sectional views corresponding to line Y1-Y1, line Y2-Y2 and line X-X of FIG. 2D.

A contact etching stop layer 136 is formed over the semiconductor structure 100 to cover the source/drain features 130N and 130P, as shown in FIGS. 2D, 2D-2 and 2D-3, in accordance with some embodiments. The contact etching stop layer 136 is further formed along, and covers, the upper surfaces of the dielectric walls 110, the upper surface of the isolation structure 116 and the sidewalls of the gate spacer layers 124 and the topmost inner spacer layers 128, in accordance with some embodiments.

In some embodiments, the contact etching stop layer 136 is made of dielectric material, such as silicon nitride (SiN), silicon oxide ($SiO_2$), silicon oxynitride (SiOC), silicon carbide (SiC), oxygen-doped silicon carbide (SiC:O), oxygen-doped silicon carbonitride (Si(O)CN), or a combination thereof. In some embodiments, a dielectric material for the contact etching stop layer 136 is globally and conformally deposited over the semiconductor structure 100 using CVD (such as LPCVD, PECVD, HDP-CVD, or HARP), ALD, another suitable method, or a combination thereof.

A first interlayer dielectric layer 138 is formed over the contact etching stop layer 136, as shown in FIGS. 2D, 2D-2 and 2D-3, in accordance with some embodiments. The first interlayer dielectric layer 138 overfills the space between dummy gate structures 118, in accordance with some embodiments. In some embodiments, the first interlayer dielectric layer 138 is made of dielectric material, such as un-doped silicate glass (USG), doped silicon oxide such as borophosphosilicate glass (BPSG), fluoride-doped silicate glass (FSG), phosphosilicate glass (PSG), borosilicate glass (BSG), and/or another suitable dielectric material.

In some embodiments, the first interlayer dielectric layer 138 and the contact etching stop layer 136 are made of different materials and have a great difference in etching selectivity. In some embodiments, the dielectric material for the first interlayer dielectric layer 138 is deposited using CVD (such as HDP-CVD, PECVD, HARP or FCVD), another suitable technique, or a combination thereof. The dielectric materials for the contact etching stop layer 136 and the first interlayer dielectric layer 138 above the top surface of the dummy gate electrode layer 122 are removed using, for example, CMP, in accordance with some embodiments.

Figure 2E:
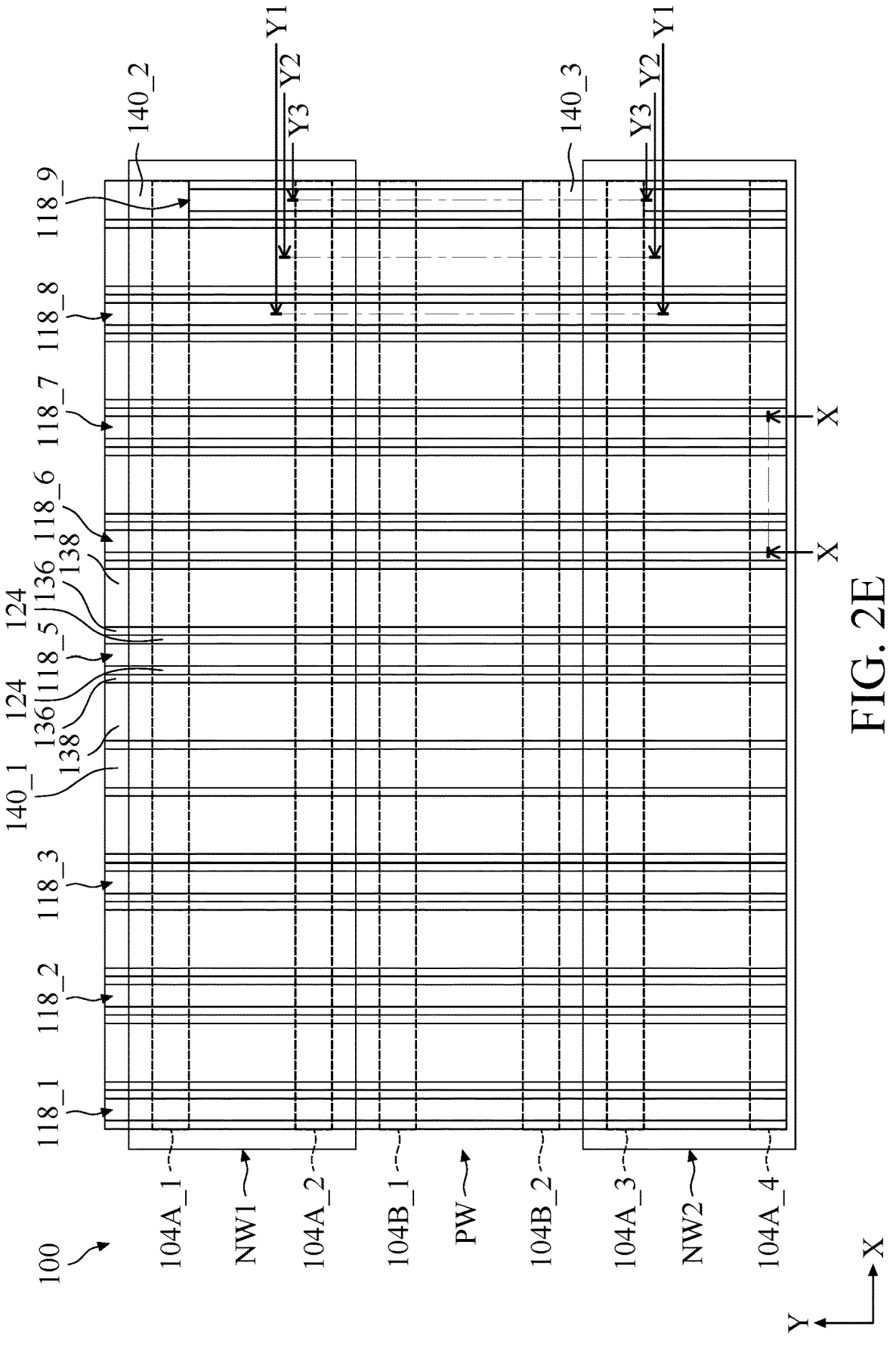
Figures 1, 2, 2E:
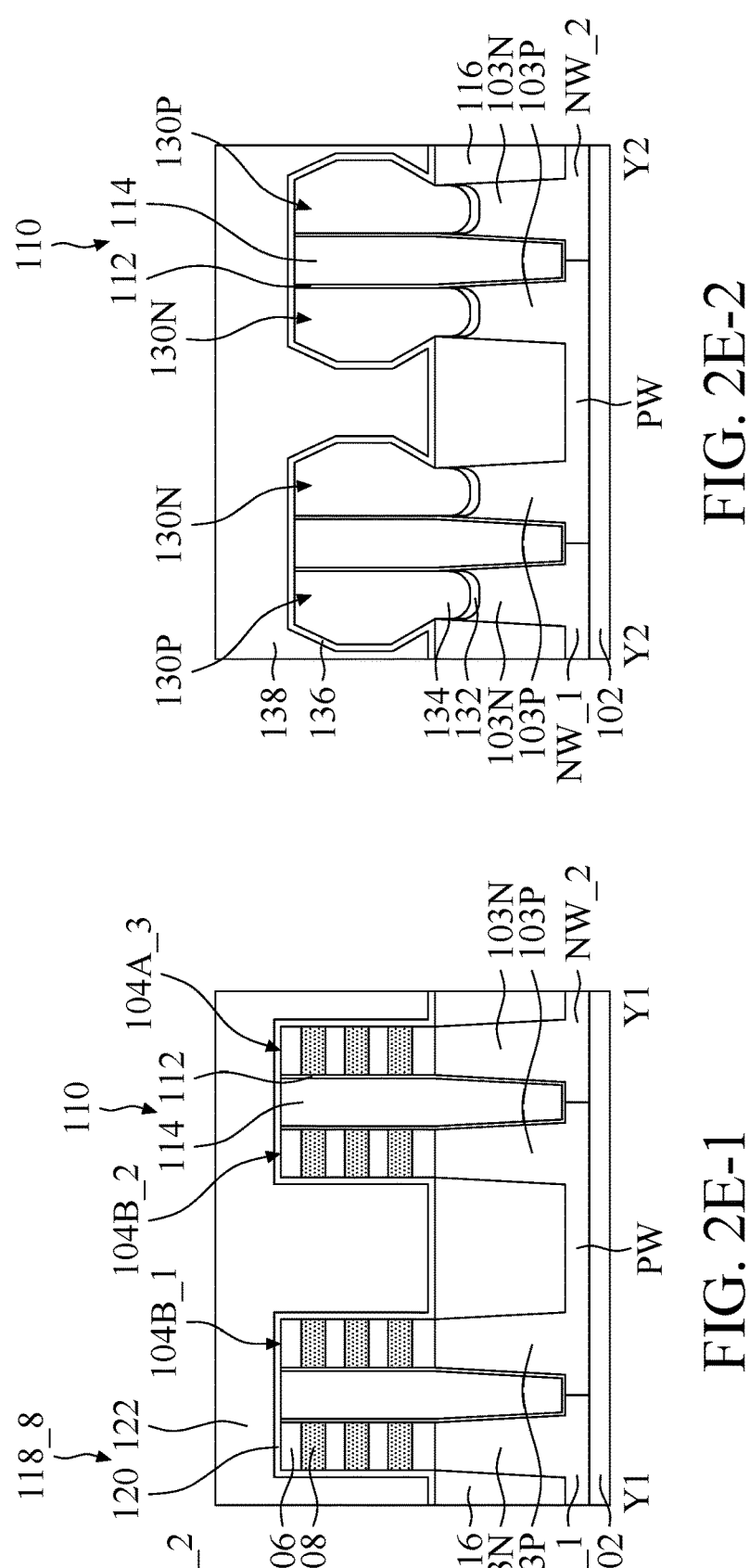
Figures 2, 2E, 3, 4:
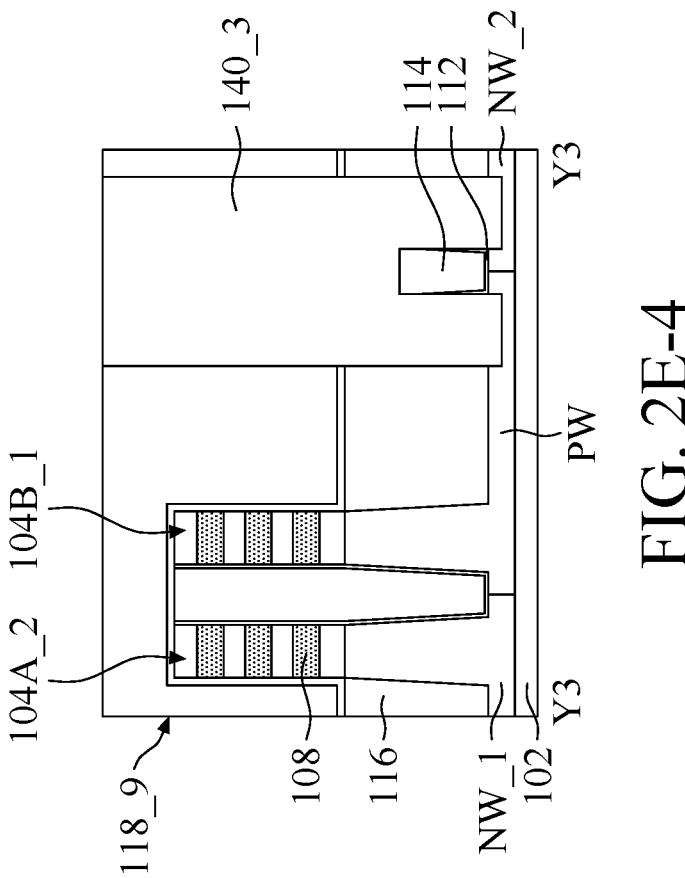
Figures 2, 2E, 3:
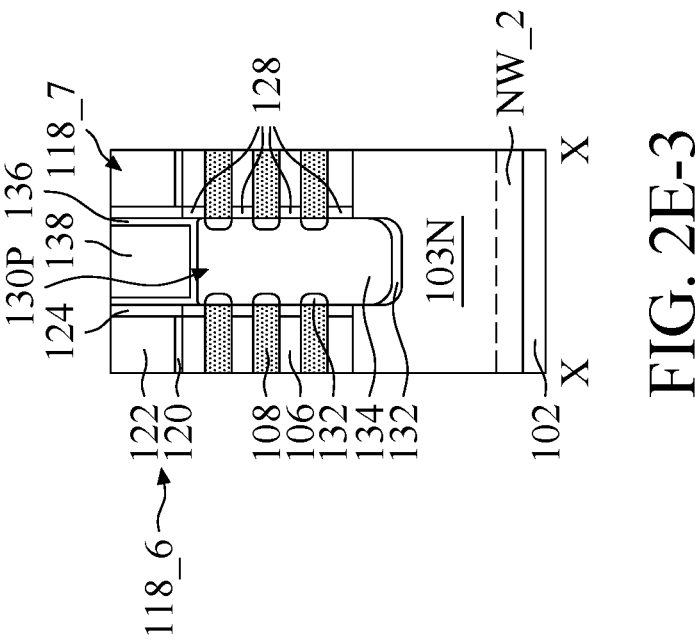
Figures 1, 2, 2F:
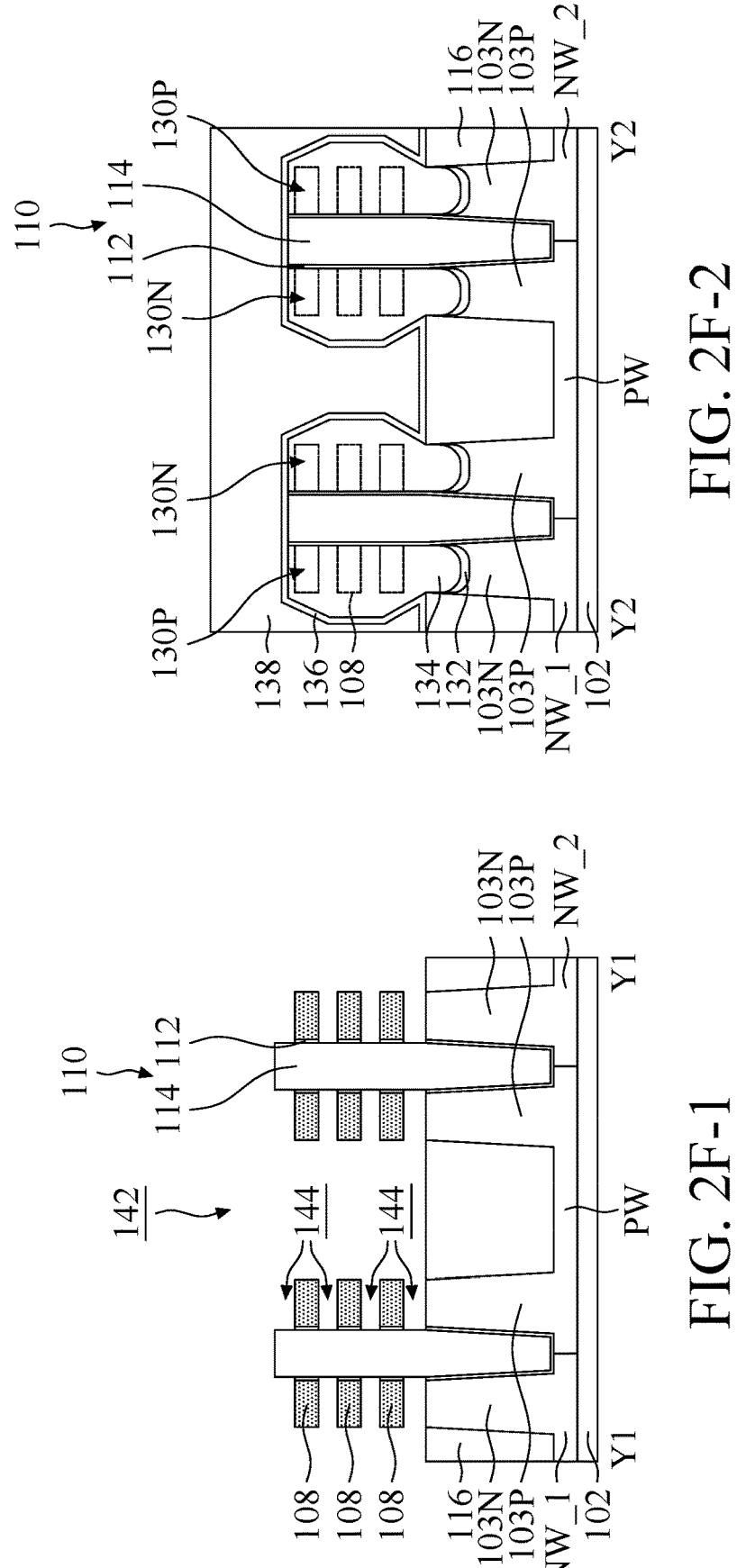
Figures 2, 2F, 3, 4:
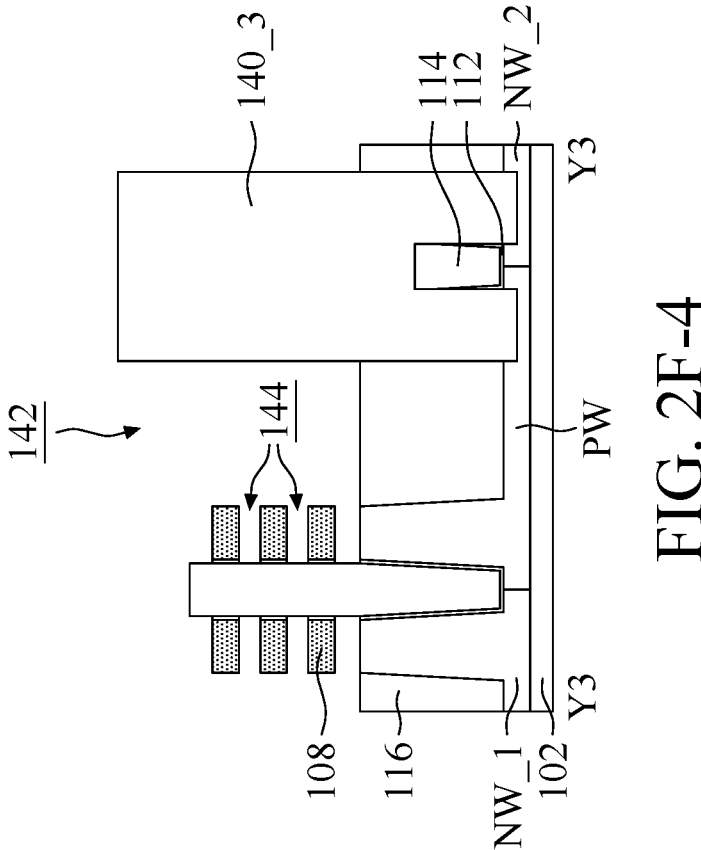
Figures 2, 2F, 3:
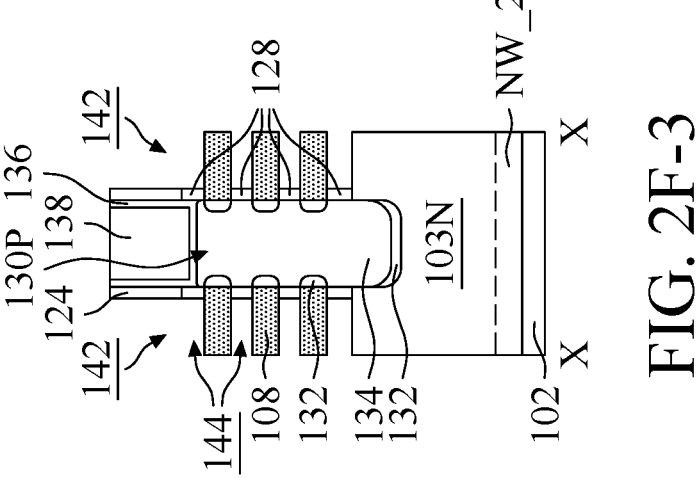

FIGS. 2E through 2E-4 illustrate a semiconductor structure 100 after the formation of fin cutting structures 140. FIG. 2D is a plan view of the semiconductor structure 100. FIGS. 2E-1, 2E-2, 2E-3 and 2E-4 are cross-sectional views corresponding to line Y1-Y1, line Y2-Y2, line X-X and line Y3-Y3 of FIG. 2E.

Fin cutting structures 140 (including 140_1 to 140_3) are formed through the dummy gate structures 118, the gate spacer layer 124 and the underlying active regions 104A and 104B and dielectric walls 110, as shown in FIGS. 2E and 2E-4, in accordance with some embodiments. The fin cutting structure 140_1 is formed in the dummy gate structures 118_4 and the active regions 104A_1 to 104A_4 and 104B_1 and 104B_2, in accordance with some embodiments. The fin cutting structure 140_2 is formed in the dummy gate structures 118_9 and the active region 104A_1, and the fin cutting structure 140_3 is formed in the dummy gate structures 118_9 and the active regions 104B_2 and 104A_3, in accordance with some embodiments.

The fin cutting structures 140 extend into the substrate 102 and have bottom surfaces lower than the bottom surface of the isolation structure 116, in accordance with some embodiments. In some embodiments, the dummy gate structure 118_4 is completely replaced with the fin cutting structure 140_1, and the dummy gate structure 118_9 are partially replaced with the fin cutting structures 140_2 and 140_3. In some embodiments, the active regions 104A and 104B are cut through by the fin cutting structures 140 into several segments that are electrically isolated from one another. In some embodiments, the dummy gate structure 118 (e.g., 118_9) is cut through by the fin cutting structures 140 into several segments that are electrically isolated from one another.

In some embodiments, the fin cutting structures 140 extend in the Y direction. The fin cutting structures 140 have longitudinal axes parallel to the Y direction, in accordance with some embodiments. That is, the dimensions (lengths) of the fin cutting structures 140 in the Y direction are greater than the dimensions (widths) of the fin cutting structures 140 in the X direction. In some embodiments, the fin cutting structures 140 are configured to prevent leakage between neighboring devices. The fin cutting structures 140 may be also referred to as cut poly gate on oxide definition edge (CPODE) pattern.

The fin cutting structures 140 are made of dielectric material such as silicon oxide ($SiO_2$), silicon oxynitride (SiON), silicon nitride (SiN), silicon carbon nitride (SiCN), silicon oxycarbonitride (SiOCN), oxygen-doped silicon carbonitride (Si(O)CN), or a combination thereof. In some embodiments, the fin cutting structures 140 include dielectric material with k-value greater than 9, such as LaO, AlO, AlON, ZrO, HfO, ZnO, ZrN, ZrAlO, TiO, TaO, YO, and/or TaCN.

The formation of the fin cutting structures 140 includes patterning the dummy gate structures 118, the active regions 104A and 104B and dielectric walls 110 using photolithography and etching processes to form cutting trenches (where the fin cutting structures 140 are to be formed), depositing a dielectric material for the fin cutting structures 140 to overfill the cutting trenches, in accordance with some embodiments. The etching process may be an anisotropic etching process such as dry plasma etching, an isotropic etching process such as dry chemical etching, remote plasma etching or wet chemical etching, and/or a combination thereof. In some embodiments, the deposition process is ALD, CVD (such as LPCVD, PECVD, HDP-CVD, or HARP), another suitable technique, or a combination thereof. A planarization process is then performed on dielectric material formed until the dummy gate structures 118 and the first interlayer dielectric layer 138 are exposed, in accordance with some embodiments. The planarization may be CMP, etching back process, or a combination thereof.

FIGS. 2F-1 through 2F-4 illustrate a semiconductor structure 100 after the formation of gate trenches 142 and gaps 144. FIGS. 2F-1, 2F-2, 2F-3 and 2F-4 are cross-sectional views corresponding to line Y1-Y1, line Y2-Y2, line X-X and line Y3-Y3 of FIG. 2E.

The dummy gate structures 118 are removed using one or more etching processes to form gate trenches 142, as shown in FIGS. 2F-1, 2F-3 and 2F-4, in accordance with some embodiments. In some embodiments, the gate trenches 142 expose the channel regions of the active regions 104A and 104B. In some embodiments, the gate trenches 142 expose one sidewall of each of the active regions 104A and 104B while the other sidewall of each of the active regions 104A and 104B is covered by the dielectric walls 110. The etching process may be an anisotropic etching process such as dry plasma etching, an isotropic etching process such as dry chemical etching, remote plasma etching or wet chemical etching, and/or a combination thereof.

In some embodiments, the gate trenches 142 further expose the top surfaces of the dielectric walls 110 and the upper surface of the isolation structure 116. In some embodiments, the gate trenches 142 further expose the sidewalls of the gate spacer layers 124 and topmost inner spacer layers 128 facing the channel region.

An etching process is performed to laterally remove, from the gate trenches 142, the first semiconductor layers 106 of the active regions 104A and 104B to form gaps 144, as shown in FIGS. 2F-1, 2F-3 and 2F-4, in accordance with some embodiments. The etching process may be an anisotropic etching process such as dry plasma etching, an isotropic etching process such as dry chemical etching, remote plasma etching or wet chemical etching, and/or a combination thereof. In some embodiments, the inner spacer layers 128 serve an etching stop layer in the etching process, which may protect the source/drain features 130N and 130P from being damaged.

After the etching processes, the three main surfaces of each of the second semiconductor layers 108 are exposed, while another main surface of each of the second semiconductor layers 108 is covered by the dielectric wall 110, in accordance with some embodiments. The exposed second semiconductor layers 108 form several sets of nanostructures 108, in accordance with some embodiments. Each set includes three nanostructures 108 vertically stacked over the lower fin elements 103N or 103P and spaced apart from one other, in accordance with some embodiments. As used herein, the term "nanostructures" refers to the semiconductor layers that are cylindrical, bar shaped and/or sheet shaped. The nanostructures 108 function as channels of the resulting semiconductor devices (e.g., nanostructure transistors), in accordance with some embodiments.

In some embodiments, the gaps 144 further expose the sidewalls of the inner spacer layers 128 facing the channel region. In some embodiments, the gaps 144 further expose the dielectric walls 110. In some embodiments, the structure formed from the two sets of nanostructures 108 and the dielectric wall 110 therebetween may be referred to as a fork-sheet structure.

A trimming process is then performed on the lining layers 112 of the dielectric walls 110, thereby enlarging the gaps 144, in accordance with some embodiments. The trimming process is an isotropic etching process, in accordance with some embodiments. The trimming process is performed until the dielectric bulk layer 114 of the dielectric walls 110 are exposed, in accordance with some embodiments.

Figure 2G:
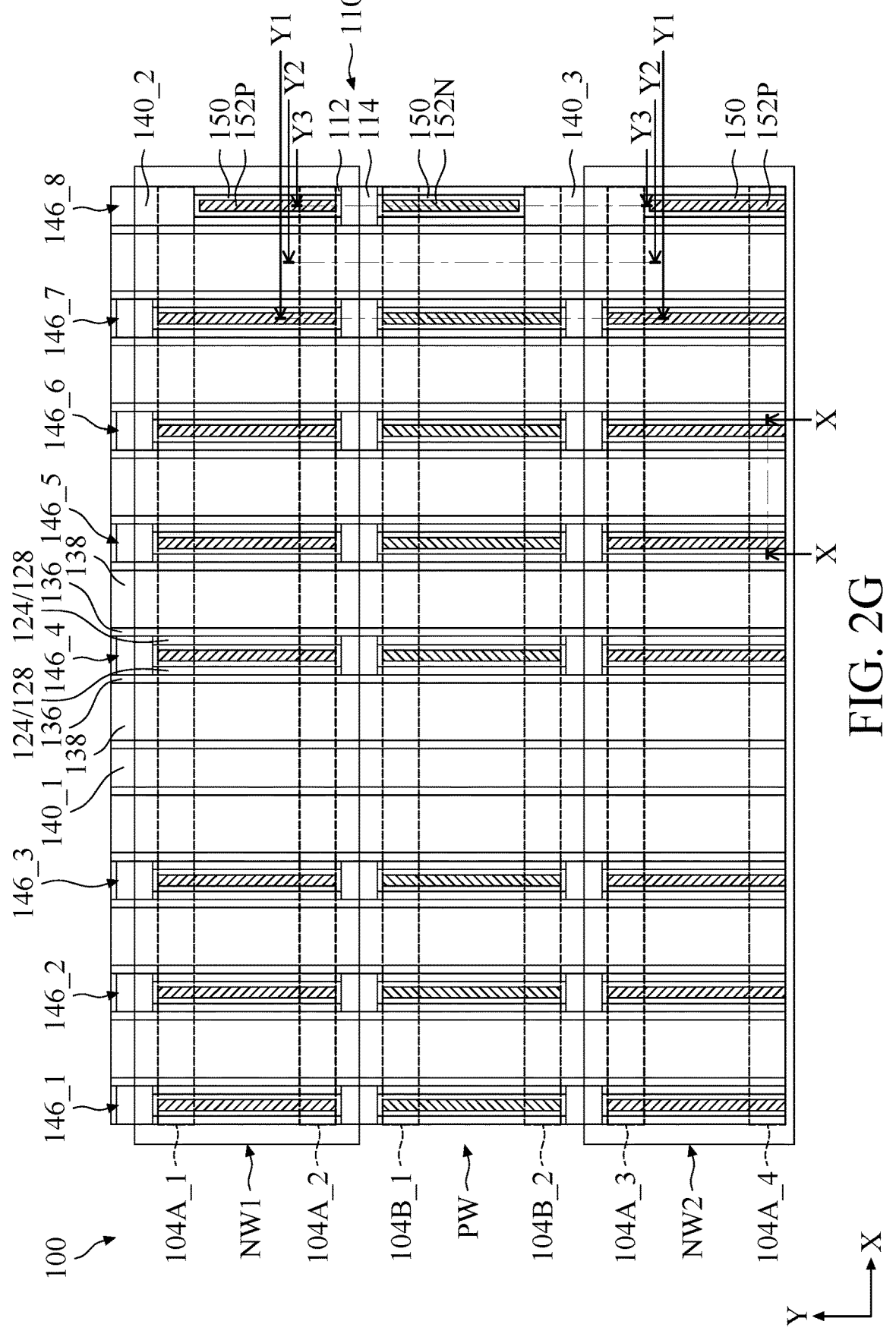
Figures 1, 2, 2G:
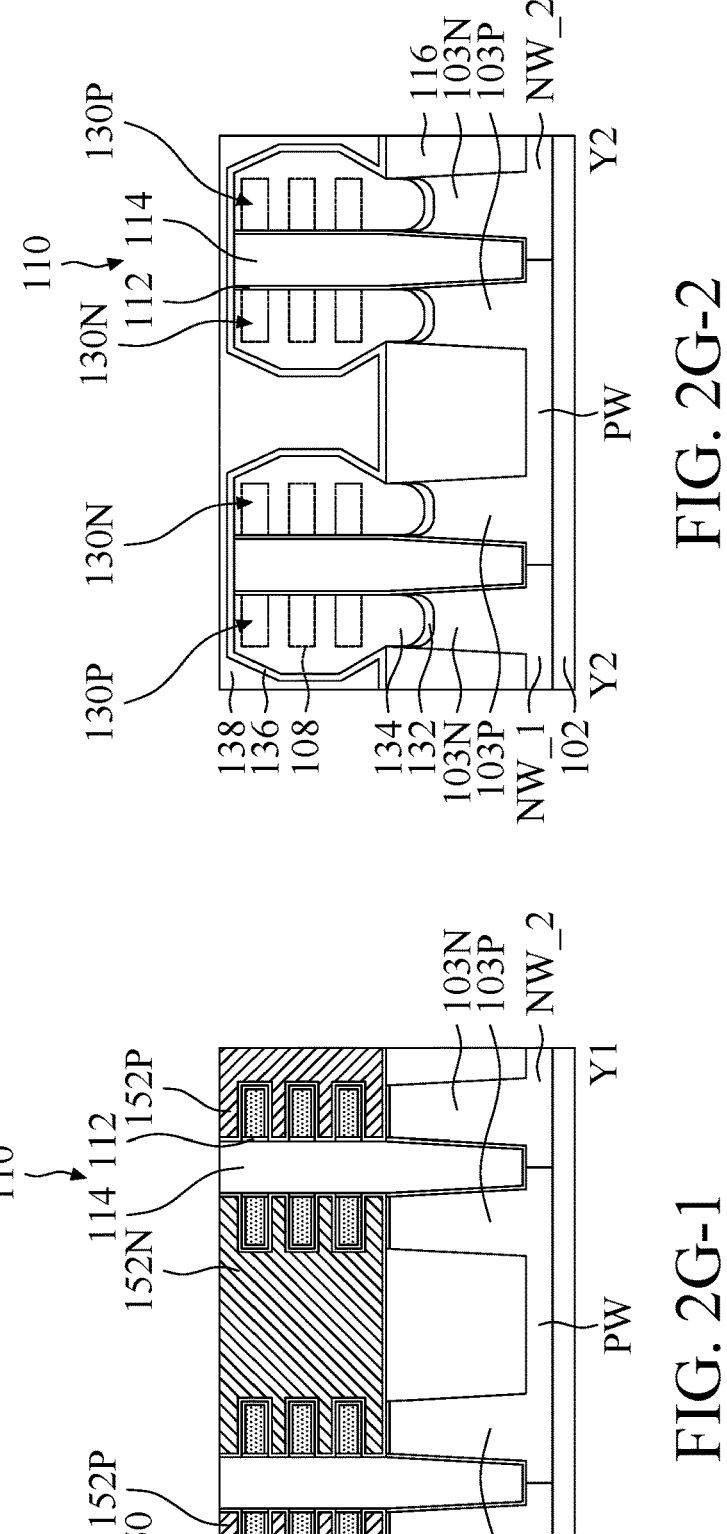
Figures 2, 2G, 3, 4:
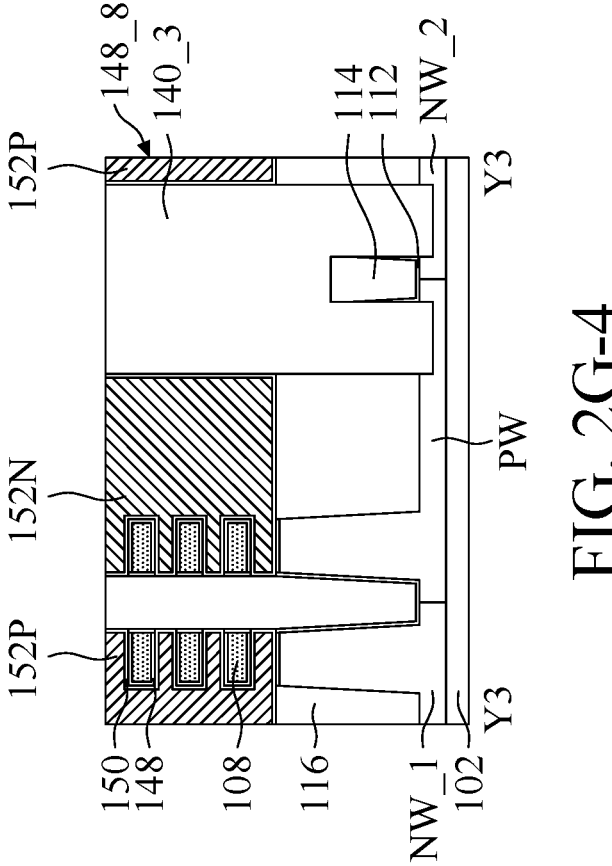
Figures 2, 2G, 3:
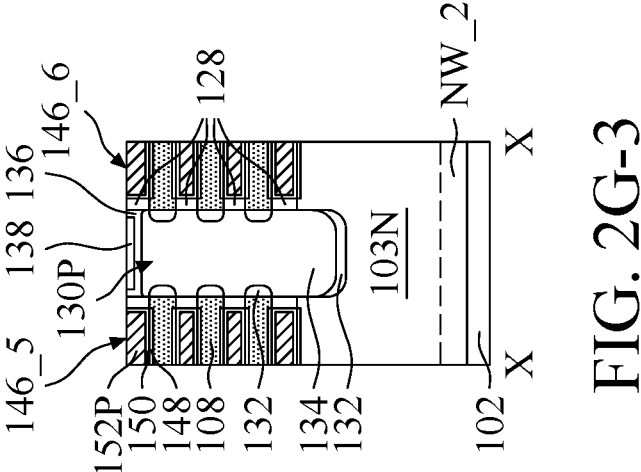

FIGS. 2G through 2G-4 illustrate a semiconductor structure 100 after the formation of final gate stacks 146. FIG. 2G is a plan view of the semiconductor structure 100. FIGS. 2G-1, 2G-2, 2G-3 and 2G-4 are cross-sectional views corresponding to line Y1-Y1, line Y2-Y2, line X-X and line Y3-Y3 of FIG. 2G.

An interfacial layer 148 is formed on the exposed surfaces of the nanostructures 108 and the lower fin elements 103N and 103P, as shown in FIGS. 2G-1, 2G-3 and 2G-4, in accordance with some embodiments. The interfacial layer 148 surrounds the nanostructures 108, in accordance with some embodiments. In some embodiments, the interfacial layer 148 is made of a chemically formed silicon oxide. Semiconductor material from the nanostructures 108 and the lower fin elements 103N and 103P is oxidized to form the interfacial layer 148, in accordance with some embodiments.

A gate dielectric layer 150 is formed conformally along the interfacial layer 148 to surround the nanostructures 108, as shown in FIGS. 2G, 2G-1, 2G-3 and 2G-4, in accordance with some embodiments. The gate dielectric layer 150 is also conformally formed along the sidewalls of the gate spacer layers 124 and the inner spacer layers 132 facing the channel region, in accordance with some embodiments. The gate dielectric layer 150 is further formed along, and covers, the top surface of the isolation structure 116 and the top surfaces and exposed sidewalls of the dielectric walls 110, in accordance with some embodiments.

The gate dielectric layer 150 may be high-k dielectric layer. In some embodiments, the high-k dielectric layer is dielectric material with high dielectric constant (k value), for example, greater than 9, such as greater than 13. In some embodiments, the high-k dielectric layer includes hafnium oxide ($HfO_2$), $TiO_2$, HfZrO, $Ta_2O_3$, $HfSiO_4$, $ZrO_2$, $ZrSiO_2$, LaO, $Al_2O_3$, ZrO, TiO, $Ta_2O_3$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba, Sr) $TiO_3$ (BST), $Si_3N_4$, oxynitrides (SiON), a combination thereof, or another suitable material. The high-k dielectric layer may be deposited using ALD, PVD, CVD, and/or another suitable technique.

The metal gate electrode layers 152 (including 152N and 152P) are formed over the gate dielectric layer 150 to fill remainders of the gate trenches 142 and the gaps 144, as shown in FIGS. 2G, 2G-1, 2G-3 and 2G-4, in accordance with some embodiments. The metal gate electrode layers 152N are formed over the p-type well PW, and the metal gate electrode layers 152P are formed over the n-type wells NW1 and NW2, in accordance with some embodiments. In some embodiments, the metal gate electrode layers 152N and 152P are made of more than one conductive material, such as a metal, metal alloy, conductive metal oxide and/or metal nitride, another suitable conductive material, and/or a combination thereof. For example, the metal gate electrode layers 152N and 152P may be made of Ti, Ag, Al, TiAlN, TaC, TaCN, TaSiN, Mn, Zr, TiN, TaN, Ru, Mo, WN, Cu, W, Re, Ir, Co, Ni, another suitable conductive material, or multilayers thereof.

The metal gate electrode layers 152N and 152P may be a multi-layer structure with various combinations of a diffusion barrier layer, work function layers with a selected work function to enhance the device performance (e.g., threshold voltage) for n-channel FETs and p-channel FETs, a capping layer to prevent oxidation of work function layers, a glue layer to adhere work function layers to a next layer, and a metal fill layer to reduce the total resistance of gate stacks, and/or another suitable layer. The metal gate electrode layers 152N and 152P may be formed using ALD, PVD, CVD, e-beam evaporation, or another suitable technique. The metal gate electrode layers 152N and 152P may be formed separately for n-channel FETs and p-channel FETs, which may use different work function materials. In alternative embodiments, the conductive material for the metal gate electrode layers 152N is the same as the conductive material for the metal gate electrode 152P.

A planarization process such as CMP may be performed on the semiconductor structure 100 to remove the gate dielectric layer 150, the metal gate electrode layers 152N and 152P, the gate spacer layers 124, the first interlayer dielectric layer 138 until the dielectric walls 110 are exposed, in accordance with some embodiments. The top surfaces of the metal gate electrode layers 152N and 152P, the dielectric walls 110 and the first interlayer dielectric layer 138 are substantially coplanar.

In some embodiments, the interfacial layer 148, the gate dielectric layer 150 and the metal gate electrode layers 152N and 152P combine to form final gate stacks 146 (e.g., including 146_1 to 146_8), as shown in FIGS. 2G, 2G-1, 2G-3 and 2G-4, in accordance with some embodiments. The final gate stacks 146_1 to 146_8 extend in the Y direction and surround multiple sets of the nanostructures 108, in accordance with some embodiments. Each of the final gate stacks 146_1 to 146_8 is divided by the dielectric walls 110 into several segments which electrically isolated from one another, in accordance with some embodiments.

The final gate stacks 146 engage the channel regions so that current can flow between the source/drain features 130N and between the source/drain features 130P during operation, in accordance with some embodiments. Each of the final gate stacks 146 combines with the neighboring source/drain features 130N/130P to form nanostructure transistors, e.g., n-channel nanostructure transistors in the p-type well PW and p-channel nanostructure transistors in the n-type wells NW1 and NW2.

Figure 2H:
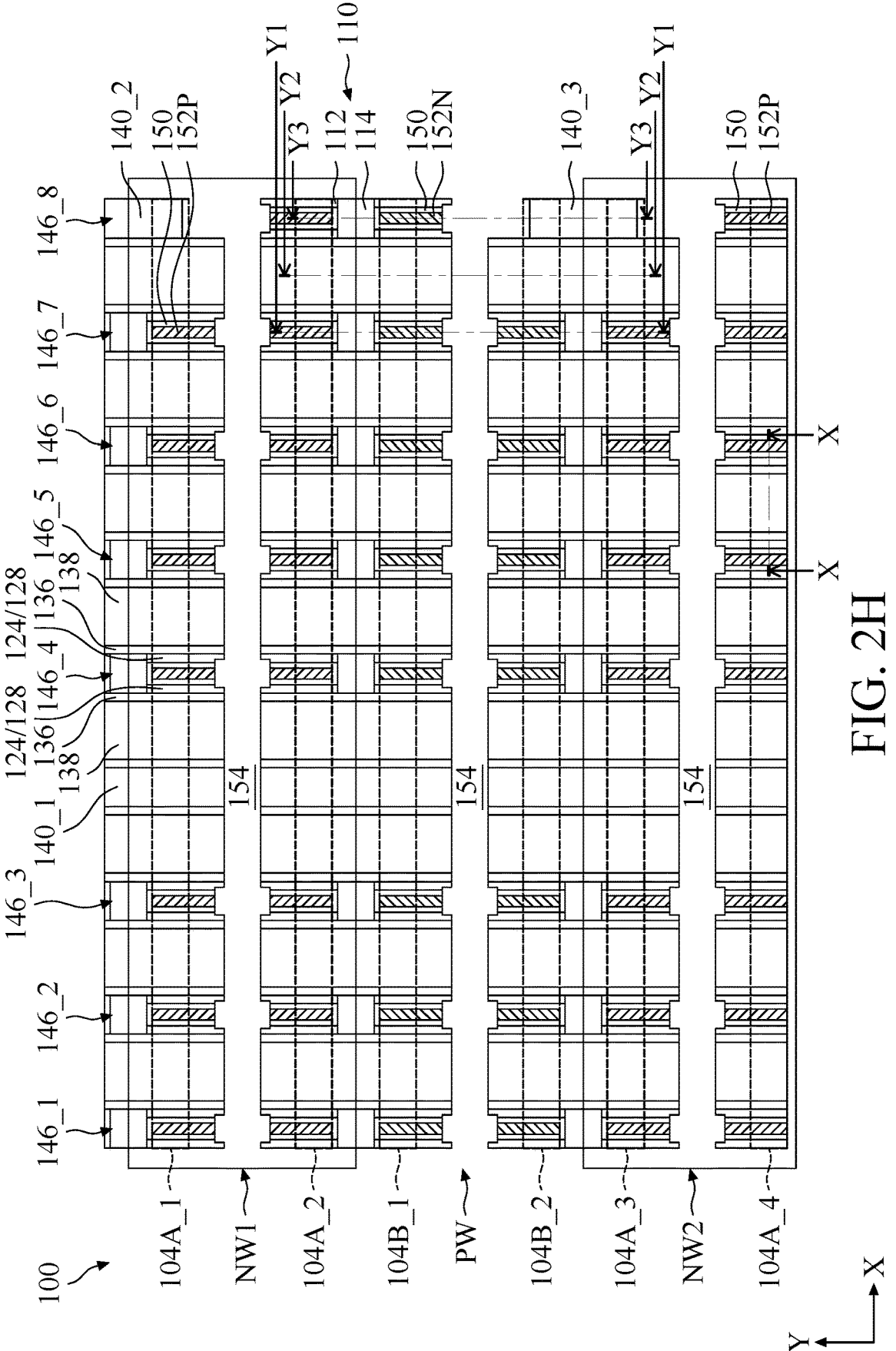
Figures 1, 2, 2H:
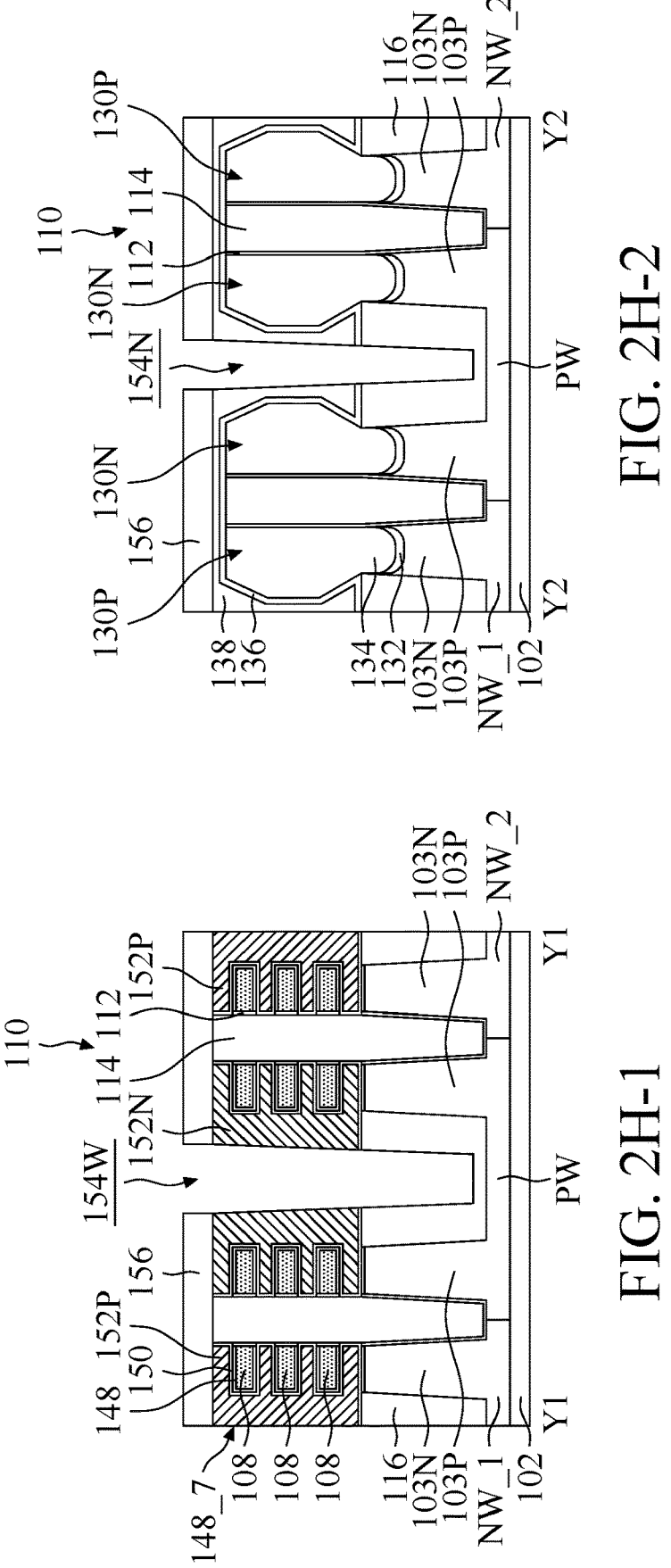
Figures 2, 2H, 3, 4:
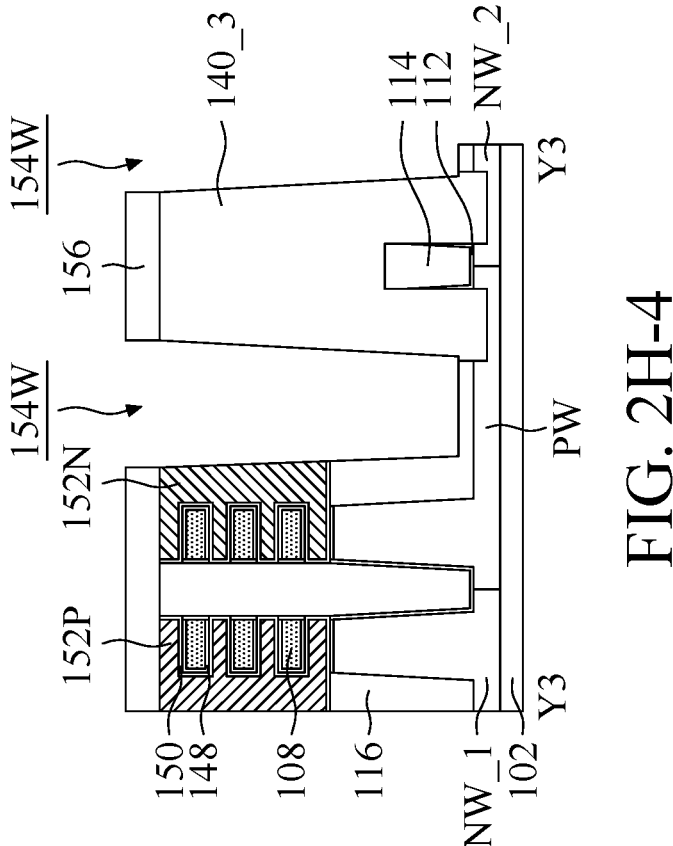
Figures 2, 2H, 3:
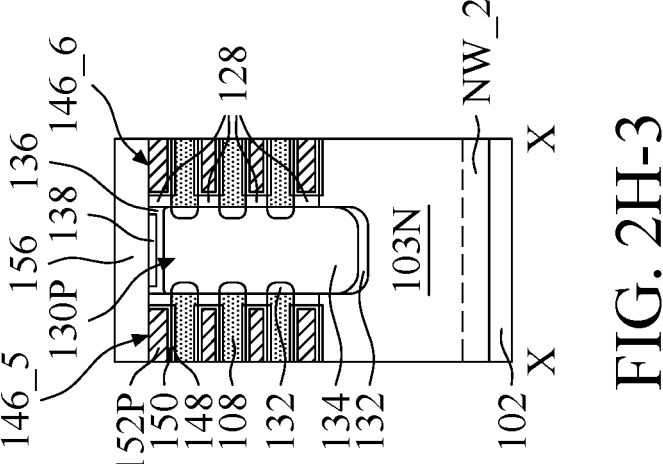
Figures 2, 2H, 3, 4, 5:
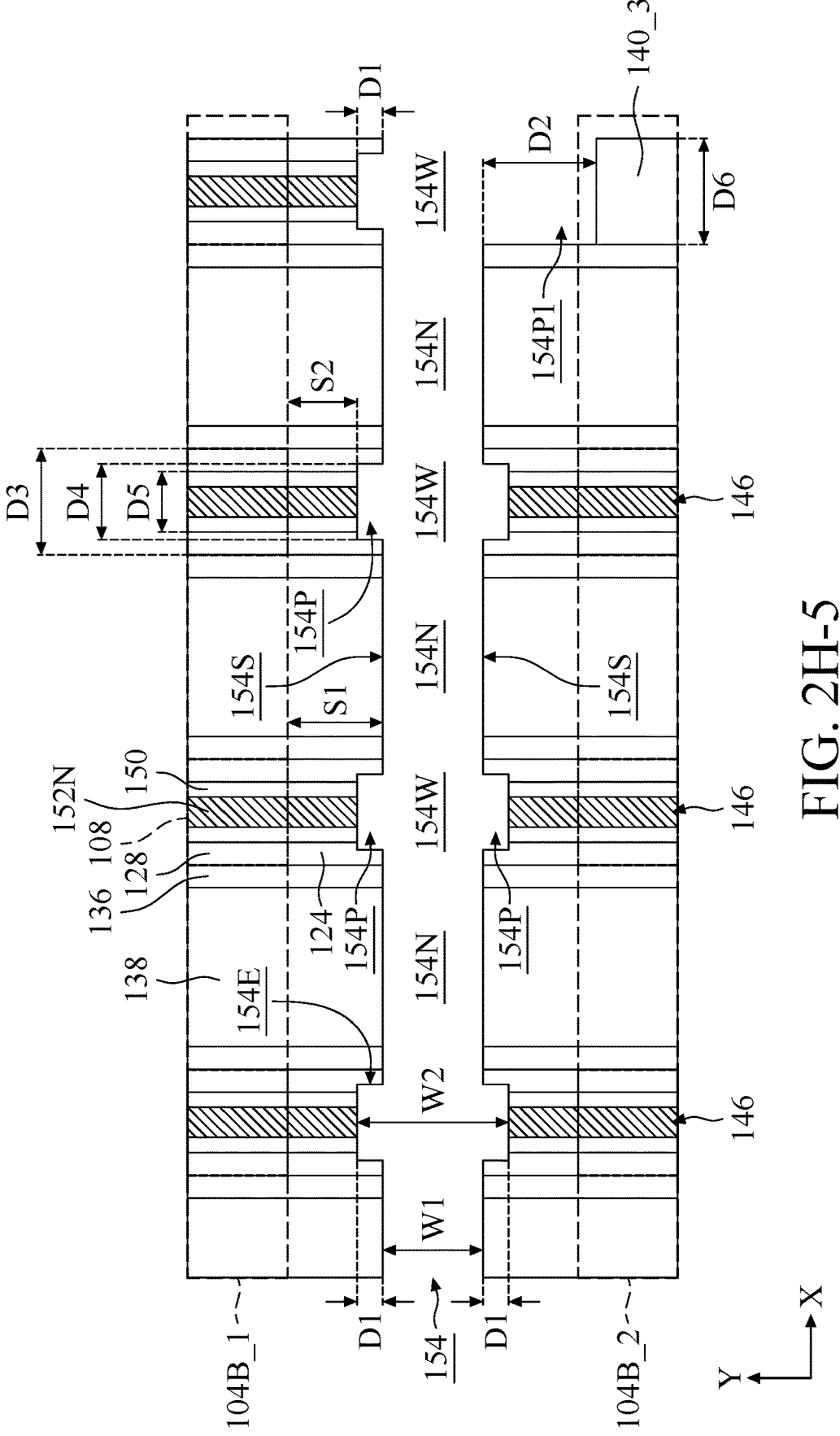

FIGS. 2H through 2H-5 illustrate a semiconductor structure 100 after the formation of cutting trenches 154. FIG. 2H is a plan view of the semiconductor structure 100. FIGS. 2H-1, 2H-2, 2H-3 and 2H-4 are cross-sectional views corresponding to line Y1-Y1, line Y2-Y2, line X-X and line Y3-Y3 of FIG. 2H. FIG. 2H-5 is an enlarged plan view of the semiconductor structure 100 to illustrate more details.

A patterning process is performed on the semiconductor structure 100 to form cutting trenches 154, as shown in FIGS. 2H, 2H-1, 2H-2, 2H-4 and 2H-5, in accordance with some embodiments. The cutting trenches 154 are located within the wells NW1, NW2 and PW and between the active regions 104A and between the active regions 104A, in accordance with some embodiments. The cutting trenches 154 have longitudinal axes parallel to the X direction, in accordance with some embodiments. That is, the dimensions (lengths) of the cutting trenches 154 in the X direction are greater than the dimensions (widths) of the cutting trenches 154 in the Y direction.

The cutting trenches 154 are formed in and/or through the final gate stacks 146_1 to 146_8, the gate spacer layers 124, the first interlayer dielectric layer 138 and the contact etching stop layer 136, in accordance with some embodiments. The cutting trenches 154 extend into isolation structure 116, in accordance with some embodiments. The final gate stacks 146 are further cut into several segments by the cutting trenches 154, in accordance with some embodiments.

The patterning process include forming a patterned mask layer 156 over the semiconductor structure 100 and etching the final gate stacks 146_1 to 146_8, the gate spacer layers 124, the first interlayer dielectric layer 138, the contact etching stop layer 136 and the isolation structure 116 using the patterned mask layer 156, in accordance with some embodiments. The etching process may be an anisotropic etching process such as dry plasma etching.

The cutting trenches 154 include narrower portions 154N corresponding to and extending into the first interlayer dielectric layer 138 and the contact etching stop layer 136, as shown in FIGS. 2H-2 and 2H-5, in accordance with some embodiments. The cutting trenches 154 further include wider portions 154W corresponding to and extending into the final gate stacks 146 and the gate spacer layers 124, as shown in FIGS. 2H-1, 2H-4 and 2H-5, in accordance with some embodiments. The narrower portions 154N and the wider portions 154W are arranged alternatingly, in accordance with some embodiments. In some embodiments, the narrower portions 154N have a width W1 (i.e., the dimension in the Y direction) and the wider portions 154W have a width W2 (i.e., the dimension in the Y direction) that is greater than the width W1.

In some embodiments, the wider portions 154W have edges 154E that extend in the Y direction. In some embodiments, the edges 154E are located within the area of the gate spacer layers 124, as shown in FIG. 2H-5. In alternative embodiments, the edges 154E of the wider portions 154W are located within the area of the portion of the contact etching stop layer 136 along the sidewalls of the gate spacer layers 124.

Each of the wider portions 154W includes two protruding portions 154P, in accordance with some embodiments. The protruding portion 154P extends a first distance D1 from the sidewalls 154S (of the narrower portions 154N) of the cutting trenches 154 toward the nanostructures 108 in the Y direction, in accordance with some embodiments. As a result, the spacing S1 between the narrower portion 154N and the active region 104A/104B is greater than the spacing S2 between the wider portion 154W and the active region 104A/104B. In some embodiments, the spacing S2 may be referred to as the end cap dimension. In some embodiments, the spacing S2 is greater than the first distance D1.

Because of the lateral growth of the source/drain features in the Y direction, the cutting trenches with a wide width may increase the risk of damage to the source/drain features. As a result, the performance and the manufacturing yield of the resulting semiconductor device may thus degrade. Furthermore, the cutting trenches with a narrow width may increase the end cap dimension, thereby increasing the overlapping area between the final gate stack and the subsequently formed contact plugs. As a result, the parasitic capacitance of the resulting semiconductor device may thus increase, which may degrade the performance of the resulting semiconductor device.

In accordance with the embodiments of the present disclosure, the cutting trenches 154 having relatively narrower portions 154N may the risk of damage to the source/drain features, while the cutting trenches 154 having relatively wider portions 154W may reduce the parasitic capacitance of the resulting semiconductor device. Therefore, the performance and the manufacturing yield of the resulting semiconductor device may increase.

The protruding portion 154P toward the fin cutting structure 140 (e.g., 140_3) is denoted as 154P1, as shown in FIG. 2H-5, in accordance with some embodiments. The protruding portion 154P1 extends a second distance D2 from the sidewalls 154S (of the narrower portions 154N) of the cutting trenches 154 toward the fin cutting structure 140 (e.g., 140_3) in the Y direction. In some embodiments, the second distance D2 is greater than the first distance D1. In some embodiments, the side portion of the fin cutting structure 140 may be partially etched away in the etching process for forming the cutting trenches 154, and one sidewall of the fin cutting structure 140_3 is exposed from the protruding portion 154P1.

Because the etching process for forming the cutting trench of the fin cutting structure may cause more lateral etching than the etching process for forming the cutting trench 154, forming the fin cutting structure with a longer length (in the Y direction) may increase the risk of damage to the source/drain features. Therefore, by forming the longer protruding portion 154P1 of the cutting trench 154, the length of the fin cutting structure 140 (e.g., 140_3) may reduce, thereby reducing the risk of damage to the source/drain features.

In addition, because the cutting trench of the fin cutting structure 140 and the cutting trench 154 may tapered downward, in some cases in which the cutting trenches 154 are formed without protruding portions, the gate material may easily remain on the bottom portion of the sidewall of the fin cutting structure 140 facing the cutting trench 154. The remaining gate material may produce leak paths. In accordance with the embodiments of the present disclosure, by forming the protruding portion 154P1 of the cutting trench 154, the risk of the gate material residue may reduce, thereby improving the manufacturing yield of the resulting semiconductor device.

In some embodiments, the nanostructures 108 have a dimension D3 in the X direction, the protruding portions 154P of the cutting trenches 154 have a dimension D4 in the X direction, and the final gate stacks 146 have a width D5 (i.e., dimension in the X direction). In some embodiments, the dimension D3 of the nanostructures 108 is greater than the dimension D4 of the protruding portions 154P, and the dimension D4 of the protruding portions 154P is greater than the width D5 of the final gate stacks 146. In some embodiments, the dimension D4 of the protruding portions 154P is greater than the first distance D1.

In some embodiments, the protruding portions 154P1 of the cutting trenches 154 have a dimension D6 in the X direction, which is greater than the dimension D4 of the protruding portions 154P. In some embodiments, the contact etching stop layers 136 are exposed from the protruding portions 154P1.

Figure 2I:
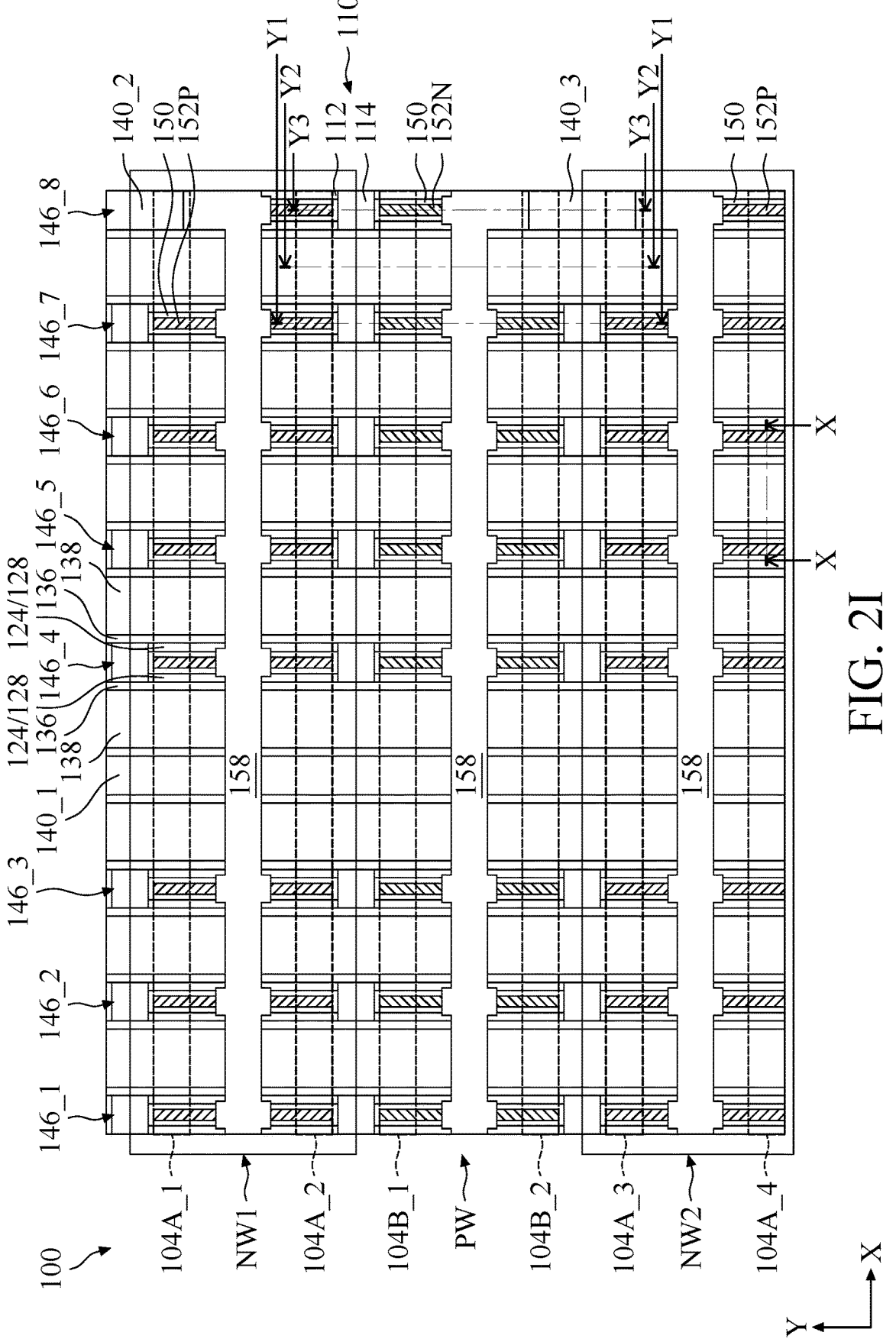
Figures 1, 2, 2I:
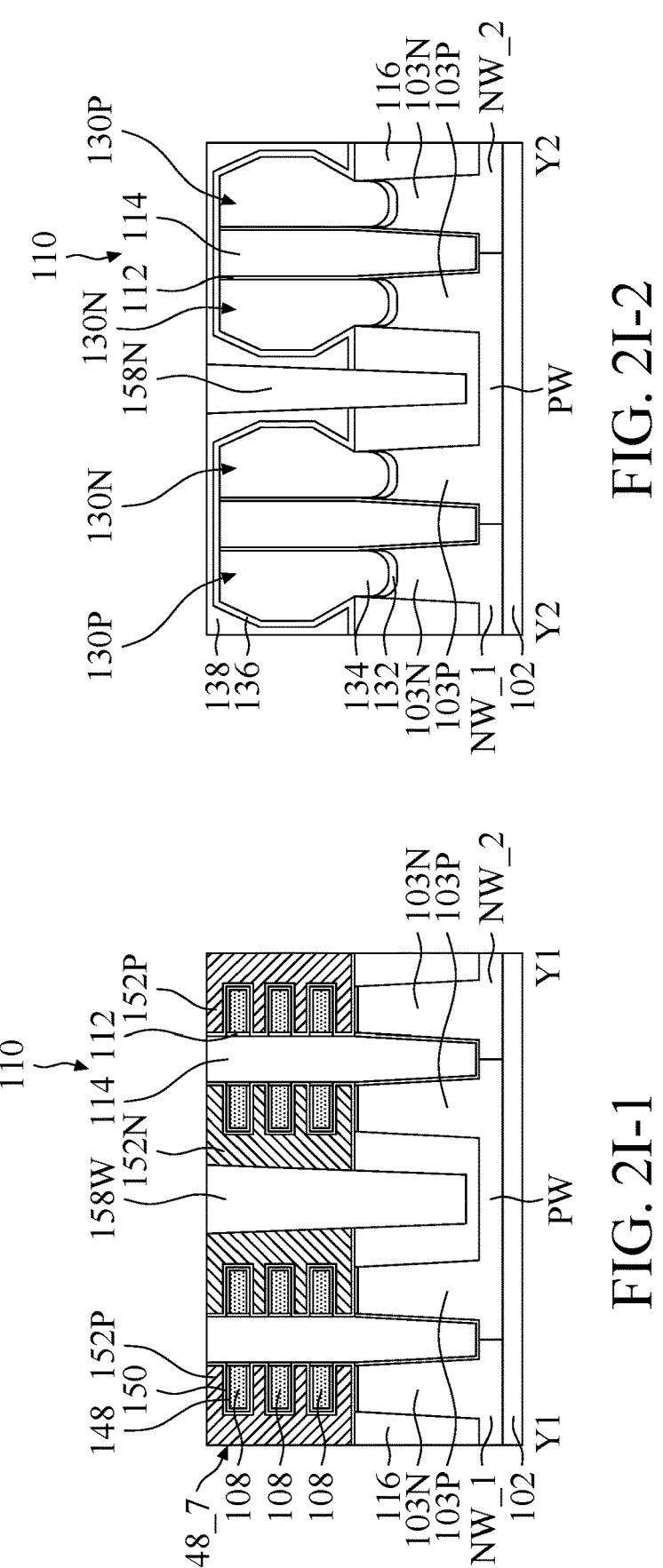
Figures 2, 2I, 3, 4:
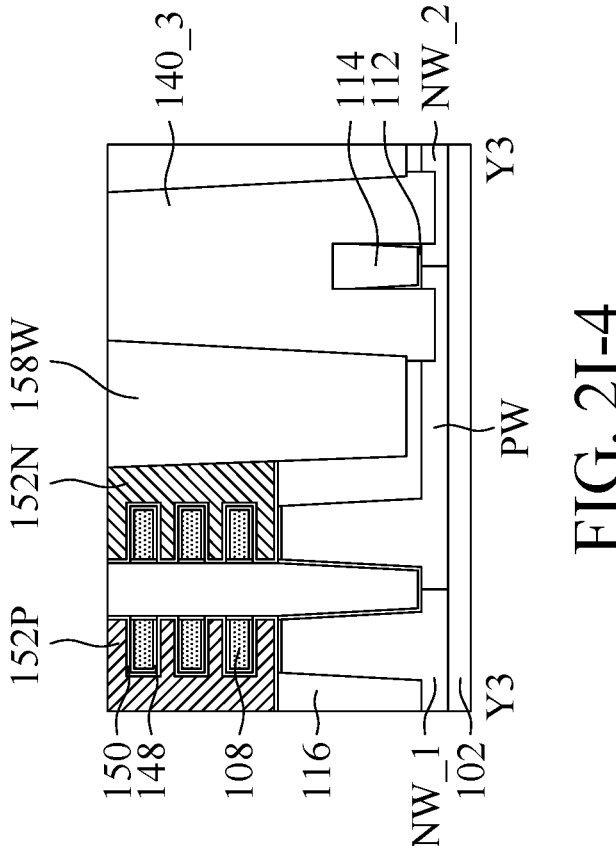
Figures 2, 2I, 3:
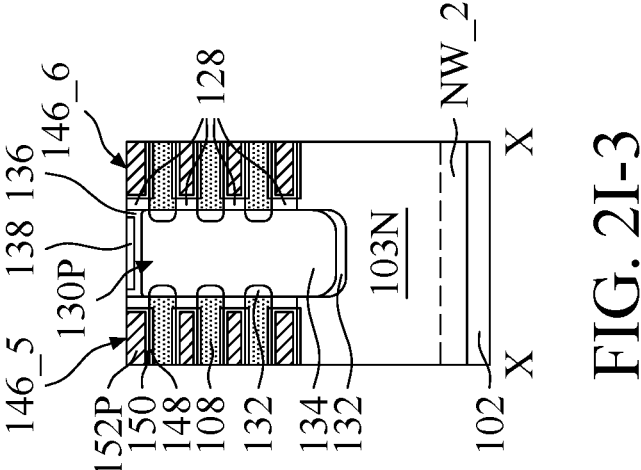
Figures 2, 2I, 3, 4, 5:
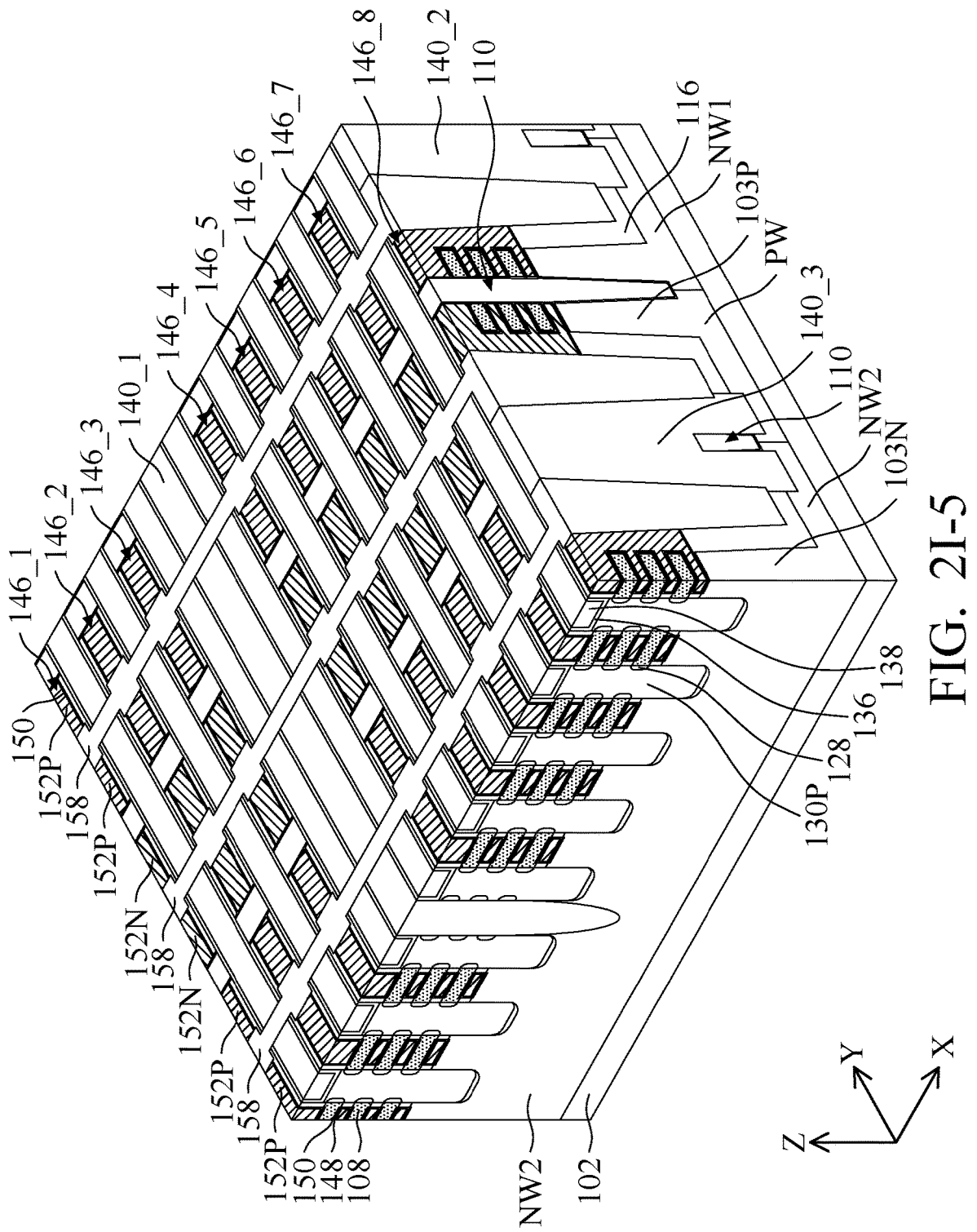
Figures 2, 2I, 3, 4, 5, 6:
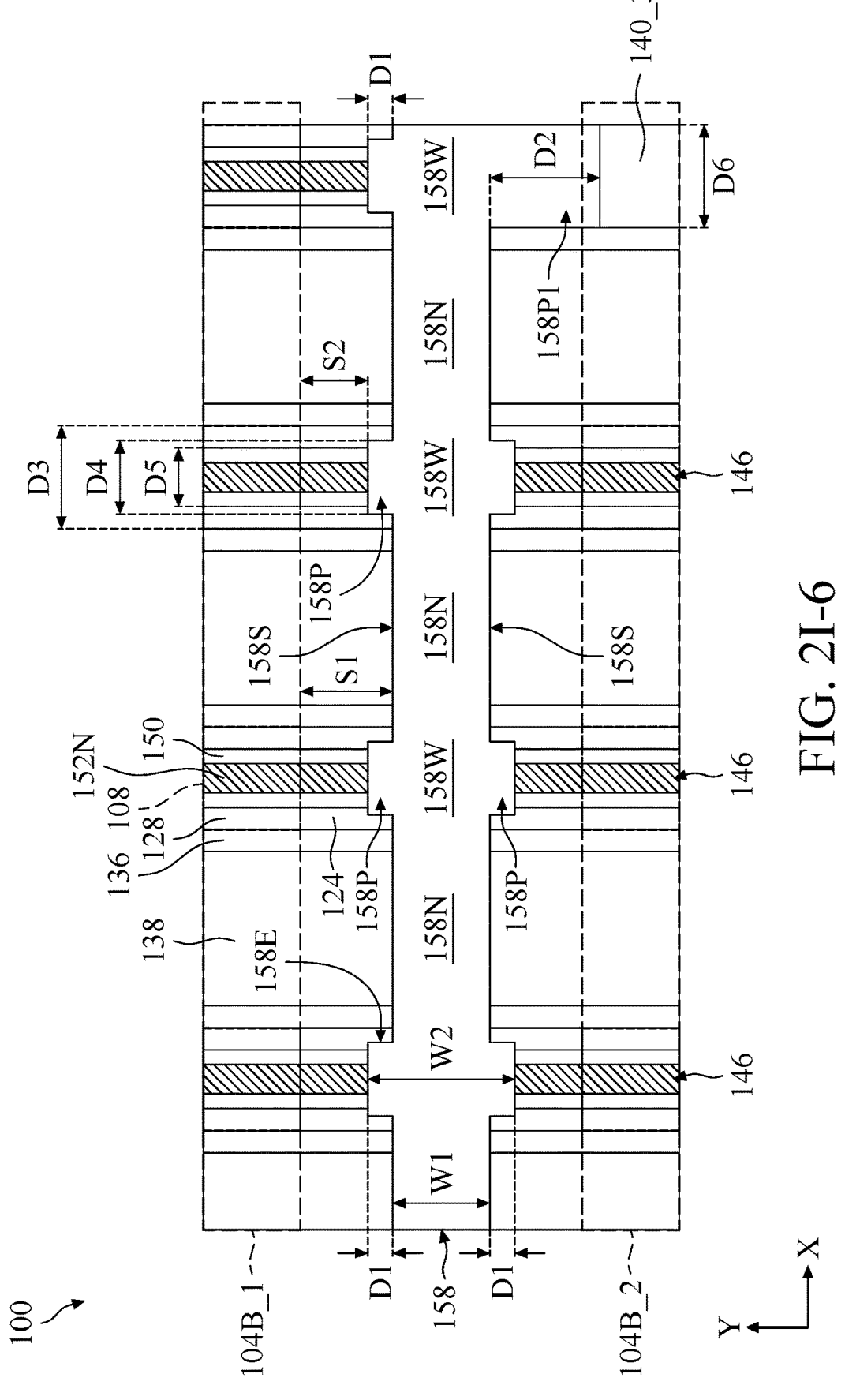

FIGS. 2I through 2I-6 illustrate a semiconductor structure 100 after the formation of gate cutting structures 158. FIG. 2I is a plan view of the semiconductor structure 100. FIGS. 2I-1, 2I-2, 2I-3 and 2I-4 are cross-sectional views corresponding to line Y1-Y1, line Y2-Y2, line X-X and line Y3-Y3 of FIG. 2I. FIG. 2H-5 is a perspective view of the semiconductor structure 100. FIG. 2H-6 is an enlarged plan view of the semiconductor structure 100 to illustrate more details.

Gate cutting structures 158 are formed in the cutting trenches 154, as shown in FIGS. 2I, 2I-1, 2I-2, 2I-4, 2I-5 and 2I-6, in accordance with some embodiments. The gate cutting structures 158 may be also referred to as cut metal gate (CMG) pattern. The segments of the final gate stacks 146₁₋₈ are physically and electrically insulated from one another by the gate cutting structures 158 and the dielectric walls 110, in accordance with some embodiments. Each of the gate segments surrounds a set of nanostructures, in accordance with some embodiments.

In some embodiments, the gate cutting structures 158 are made of dielectric material such as silicon nitride (SiN), silicon oxynitride (SiON), silicon carbon nitride (SiCN), silicon oxycarbonitride (SiOCN), oxygen-doped silicon carbonitride (Si(O)CN), silicon oxide (SiO₂), or a combination thereof. In some embodiments, the gate cutting structures 158 include dielectric material with k-value greater than 9, such as LaO, AlO, AlON, ZrO, HfO, ZnO, ZrN, ZrAlO, TiO, TaO, YO, and/or TaCN.

The formation of the gate cutting structures 158 includes depositing a dielectric material for the gate cutting structures 158 to overfill the cutting trenches 154, in accordance with some embodiments. In some embodiments, the deposition process is ALD, CVD (such as LPCVD, PECVD, HDP-CVD, or HARP), another suitable technique, or a combination thereof. Afterward, a planarization process is then performed on the dielectric material for the gate cutting structures 158 until the final gate stacks 146, the dielectric walls 110 and the first interlayer dielectric layer 138 are exposed, in accordance with some embodiments. The planarization may be CMP, an etching back process, or a combination thereof. The patterned mask layer 156 may be also removed in the planarization process.

The gate cutting structures 158 include narrower portions 158N corresponding to extending into the first interlayer dielectric layer 138 and the contact etching stop layer 136 and the isolation structure 116, as shown in FIGS. 2I-2 and 2I-6, in accordance with some embodiments. The gate cutting structures 158 further include wider portions 158W corresponding to extending into the final gate stacks 146 and the gate spacer layers 124 and the isolation structure 116, as shown in FIGS. 2I-1, 2I-4 and 2I-6, in accordance with some embodiments. The narrower portions 158N and the wider portions 158W are arranged alternatingly, in accordance with some embodiments. In some embodiments, the narrower portions 158N have a width W1 (i.e., the dimension in the Y direction) and the wider portions 158W have a width W2 (i.e., the dimension in the Y direction) that is greater than the width W1.

In some embodiments, the wider portions 158W have edges 158E that extend in the Y direction. In some embodiments, the edges 158E are located within the area of the gate spacer layers 124. In alternative embodiments, the edges 158E of the wider portions 158W are located within the area of the portion of the contact etching stop layer 136 along the sidewalls of the gate spacer layers 124.

Each of the wider portions 158W includes two protruding portions 158P, in accordance with some embodiments. The protruding portion 158P extends a first distance D1 from the sidewalls 158S (of the narrower portions 158N) of the gate cutting structure4 158 toward the nanostructures 108 in the Y direction, in accordance with some embodiments. As a result, the spacing S1 between the narrower portion 158N and the active region 104A/104B is greater than the spacing S2 between the wider portion 158W and the active region 104A/104B. In some embodiments, the spacing S2 is greater than the first distance D1.

The protruding portion 158P facing the fin cutting structure 140 (e.g., 140_3) is denoted as 158P1, as shown in FIG. 2I-6, in accordance with some embodiments. The protruding portion 158P1 extends a second distance D2 from the sidewalls 158S (of the narrower portions 158N) of the gate cutting structure 158 toward the fin cutting structure 140 (e.g., 140_3) in the Y direction. In some embodiments, the second distance D2 is greater than the first distance D1. In some embodiments, the fin cutting structure 140_3 is in direct contact with the protruding portion 158P1. In some embodiments, the fin cutting structure 140_3 has a portion directly below the protruding portion 158P, as shown in FIG. 2I-4.

In some embodiments, the protruding portions 158P of the gate cutting structure 158 have a dimension D4 in the X direction. In some embodiments, the dimension D3 of the nanostructures 108 is greater than the dimension D4 of the protruding portions 158P, and the dimension D4 of the protruding portions 158P is greater than the width D5 of the final gate stack 146. In some embodiments, the dimension D4 of the protruding portions 158P is greater than the first distance D1.

The protruding portions 158P1 of the gate cutting structure 158 have a dimension D6 in the X direction, which is greater than the dimension D4 of the protruding portions 158P. In some embodiments, the contact etching stop layer 136 is in direct contact with the protruding portions 158P1.

FIGS. 2J-1 through 2J-5 illustrate a semiconductor structure 100 after the formation of a second interlayer dielectric layer and a contact plug 162. FIGS. 2J-1, 2J-2, 2J-3 and 2J-4 are cross-sectional views corresponding to line Y1-Y1, line Y2-Y2, line X-X and line Y3-Y3 of FIG. 2I. FIG. 2J-5 is an enlarged plan view of the semiconductor structure 100 to illustrate more details.

A second interlayer dielectric layer 160 is formed over the semiconductor structure 100, as shown in FIGS. 2J-1 to 2J-4, in accordance with some embodiments. In some embodiments, the second interlayer dielectric layer 160 is made of dielectric material, such as USG, BPSG, FSG, PSG, BSG, and/or another suitable dielectric material. In some embodiments, the second interlayer dielectric layer 160 is deposited using such as CVD (such as HDP-CVD, PECVD, HARP or FCVD), another suitable technique, or a combination thereof.

Contact plugs 162 are formed in and/or through the second interlayer dielectric layer 160, the first interlayer dielectric layer 138 and the contact etching stop layer 136 and land on the source/drain features 130N (and the source/drain features 130P), as shown in FIGS. 2J-2 and 2J-5, in accordance with some embodiments. The contact plugs 162 extend across the narrow portions 158N of the gate cutting structures 158, in accordance with some embodiments. The contact plugs 162 are electrically connected to the source/drain features 130N (and the source/drain features 130P), in accordance with some embodiments.

In some embodiments, the formation of the contact plugs 162 includes patterning the second interlayer dielectric layer 160, the gate cutting structures 158, the first interlayer dielectric layer 138 and the contact etching stop layer 136 to form contact openings (where the contact plugs 162 are to be formed) using photolithography and etching processes until the source/drain features 130 are exposed. The etching process may include dry etching such as reactive ion etch (RIE), neutral beam etch (NBE), inductive coupled plasma (ICP) etch, capacitively coupled plasma (CCP) etch, another suitable method, or a combination thereof. In some embodiments, the portions of the contact etching stop layer 136 formed along the gate spacer layers 124 are entirely removed, thereby exposing the sidewalls of the gate spacer layers 124.

Figures 2, 2J:
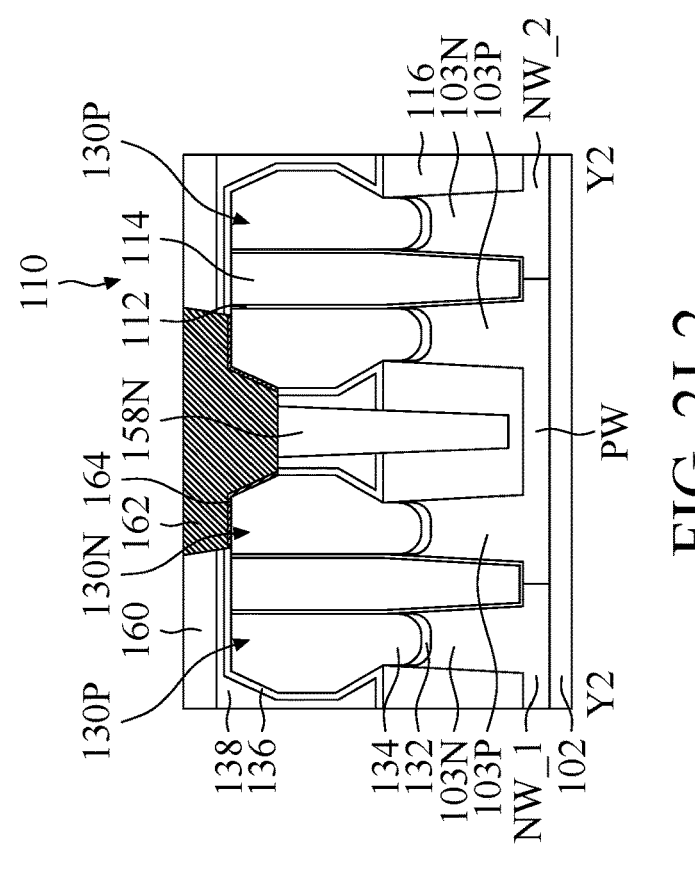
Figures 1, 2J:
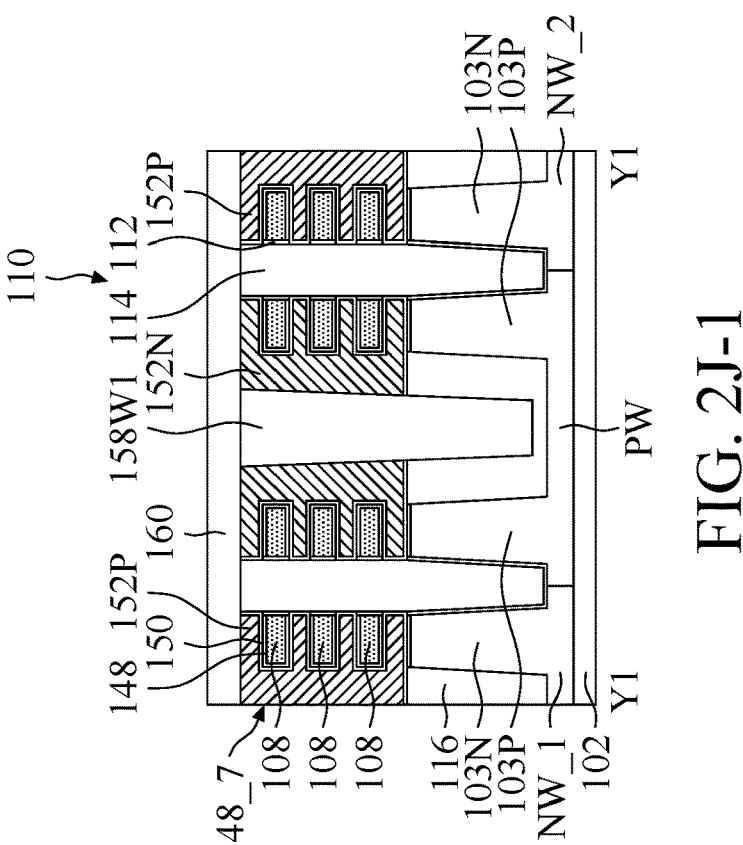
Figures 2, 2J, 3, 4:
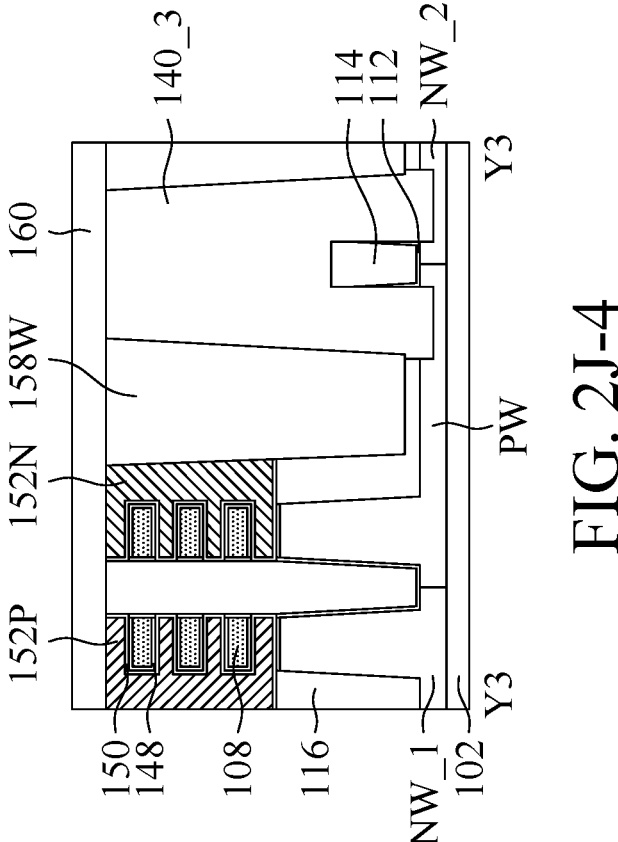
Figures 2, 2J, 3:
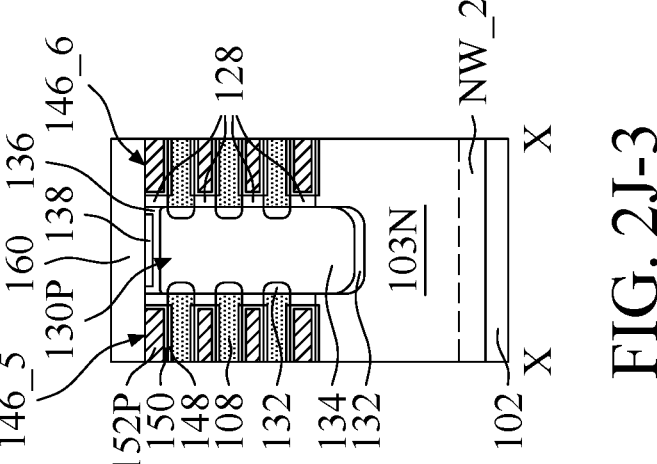
Figures 2, 2J, 3, 4, 5:
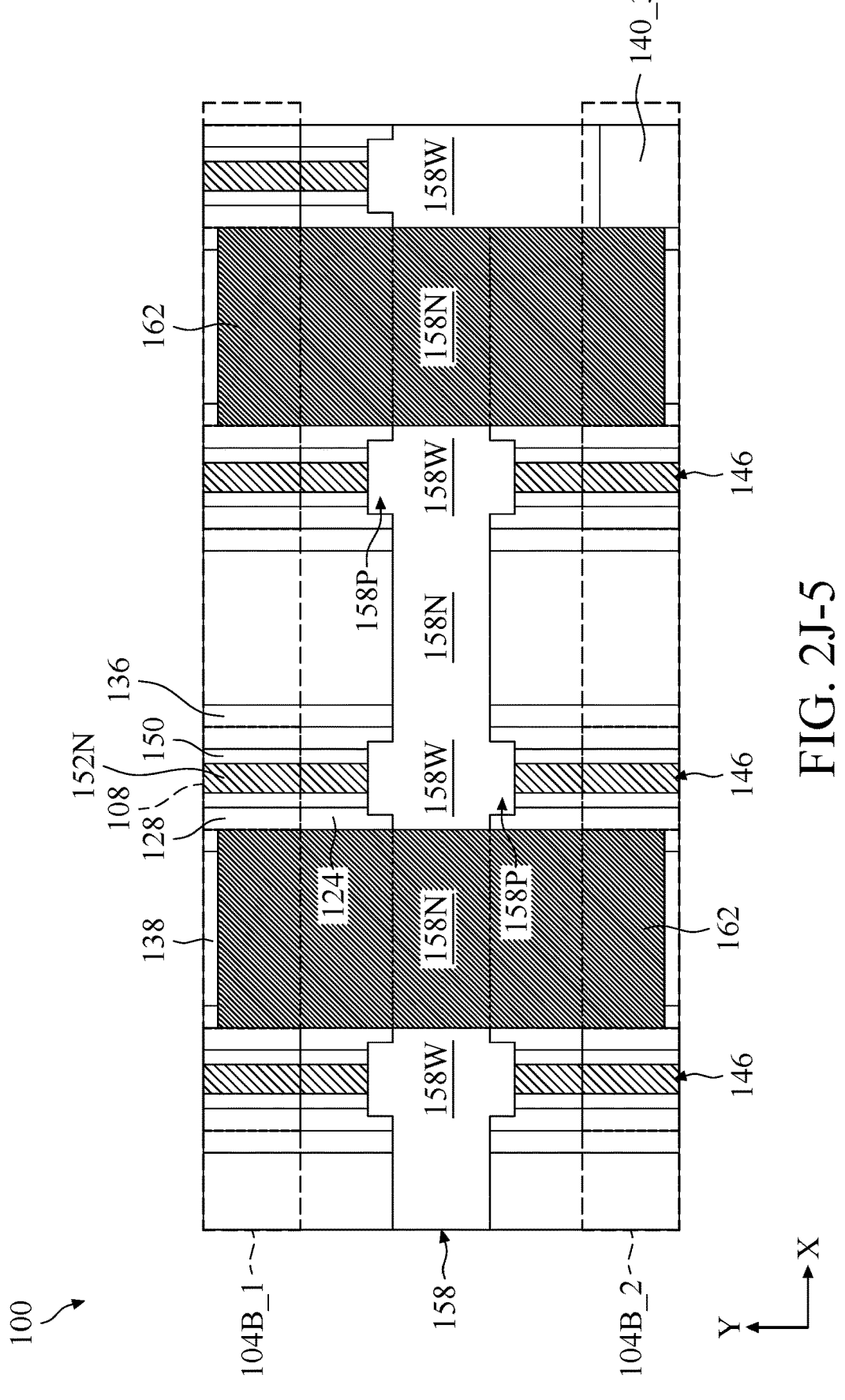
Figure 3:
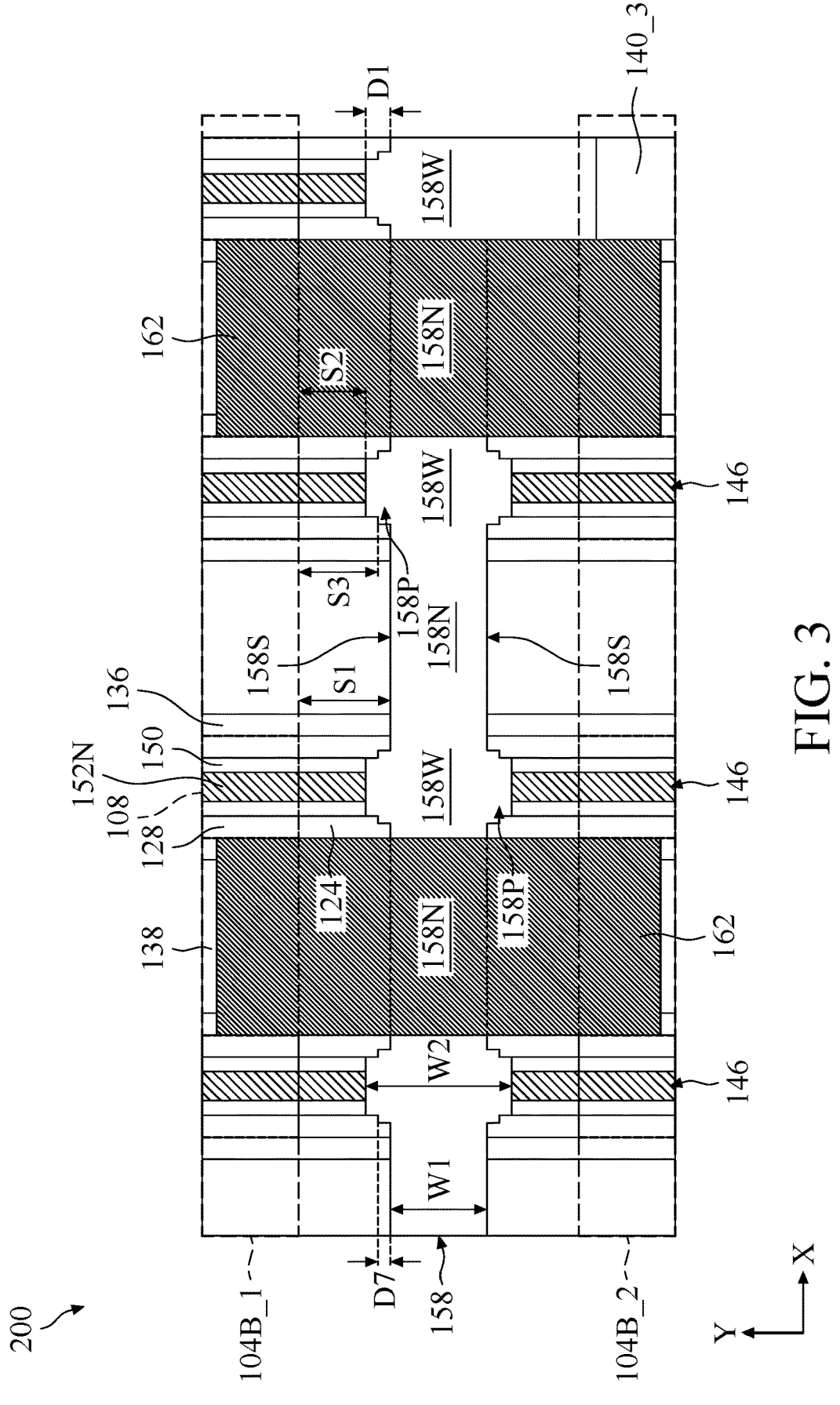
Figure 4:
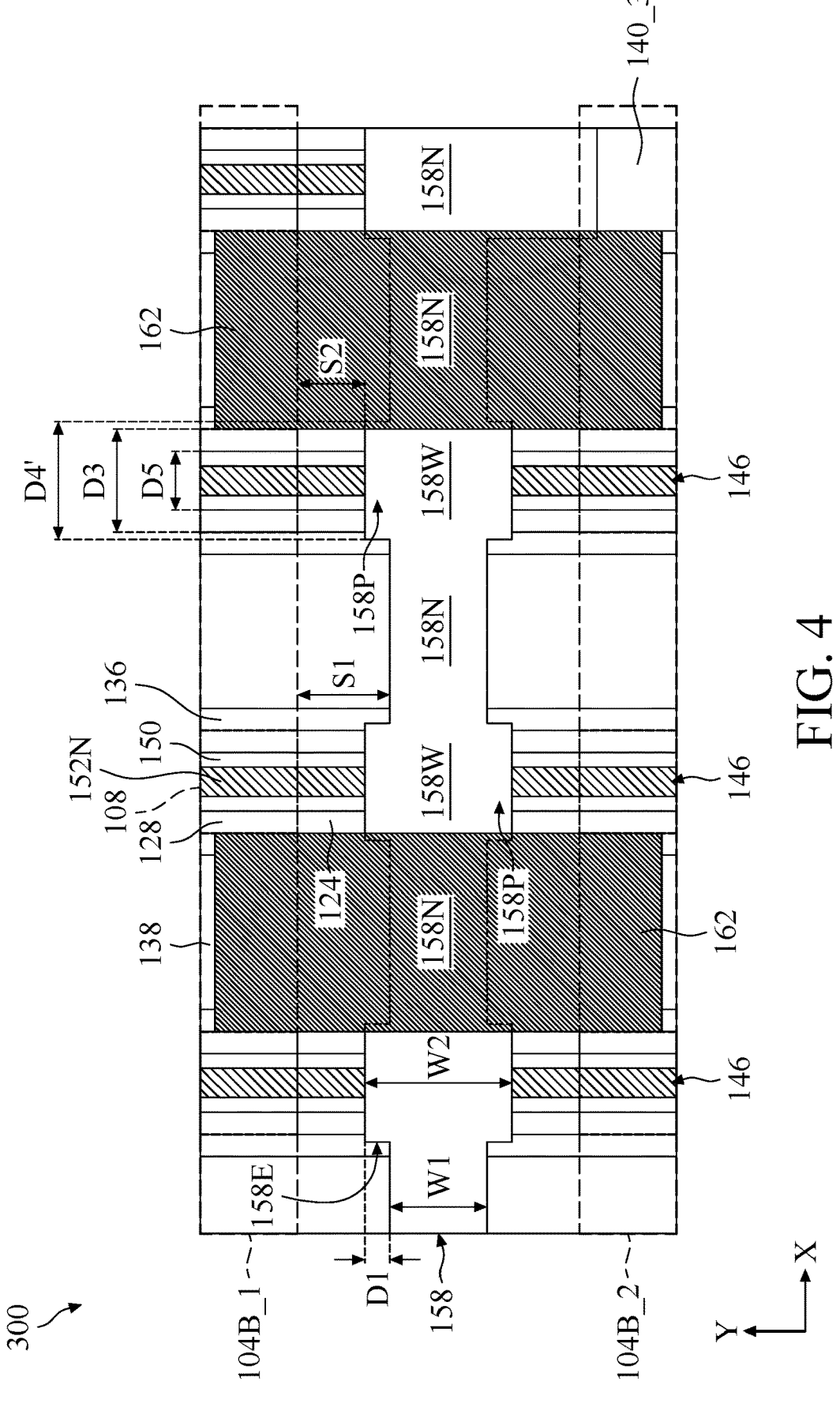
Figure 5:
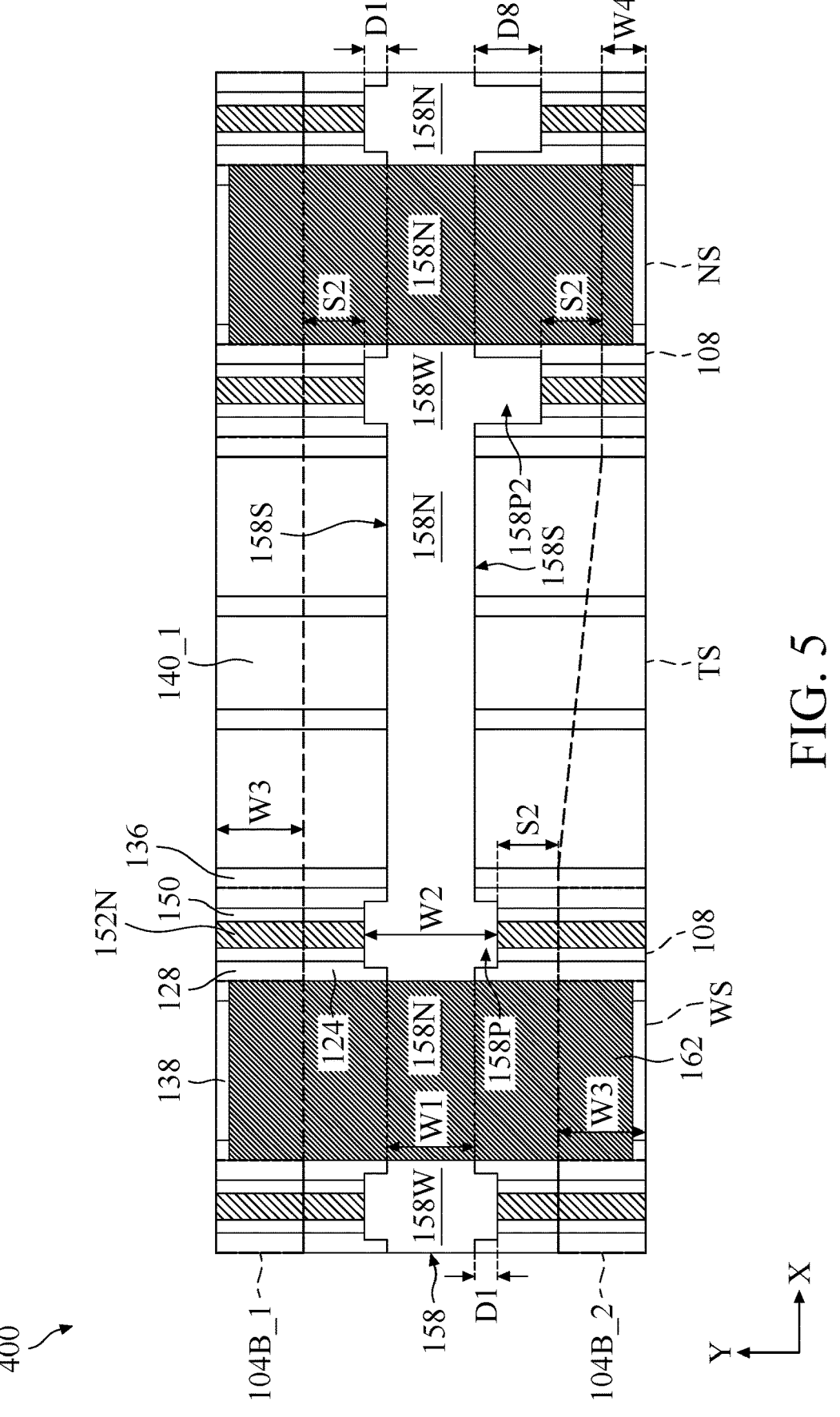
Figure 6:
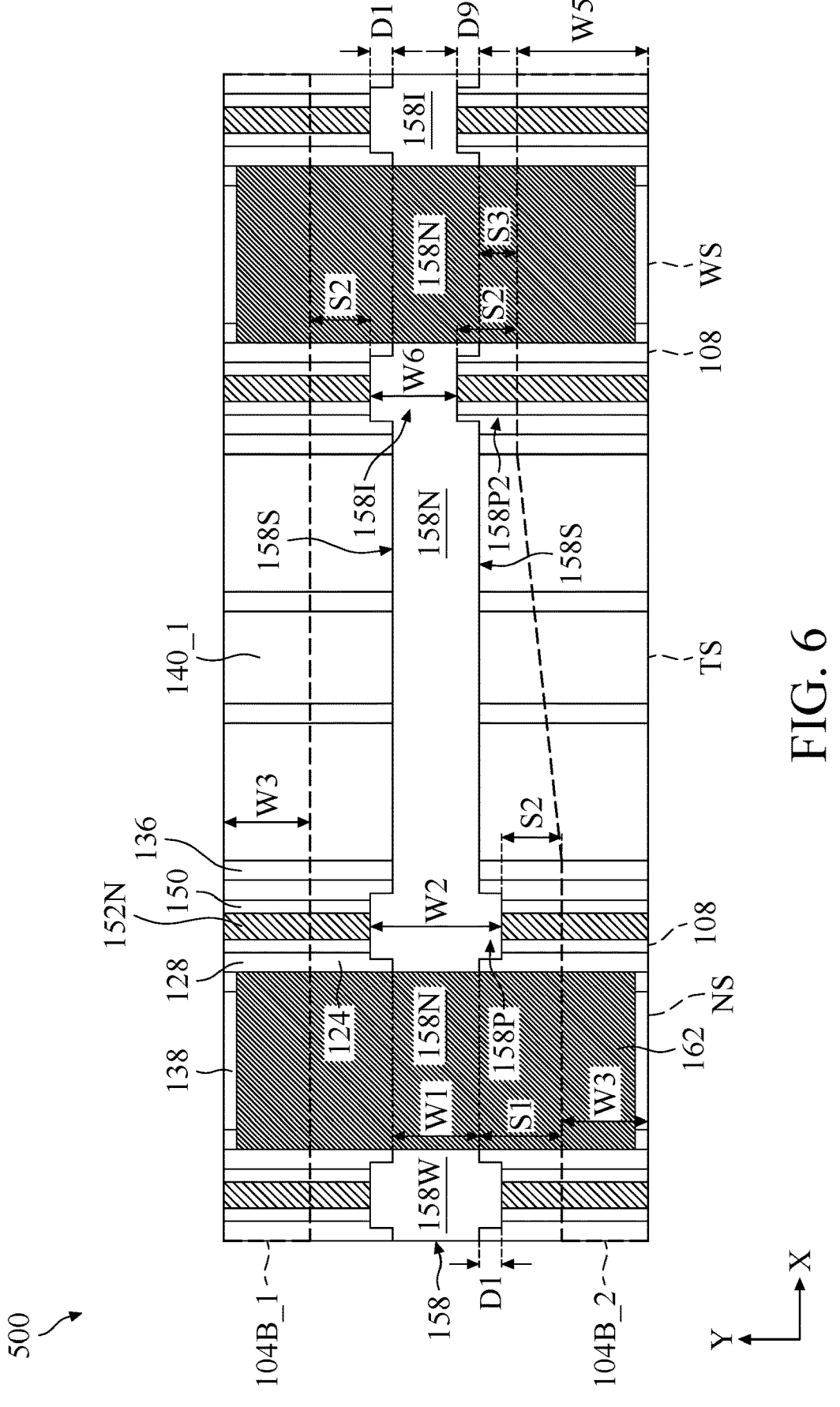

In some embodiments, the narrower portions 158N of the gate cutting structures 158 are also recessed, as shown in FIG. 2J-2. As such, the wider portions 158W are thicker than the narrower portions 158N in the Z direction.

In the etching process for forming the contact openings, the wider portions 158W of the gate cutting structures 158 may resist lateral etching, thereby preventing the contact plugs 162 from being too close to the final gate stack 146, in accordance with some embodiments. Therefore, the risk of leak between the final gate stack 146 and the contact plug 162 may reduce.

A Silicide layer 164 is formed on the exposed surfaces of the source/drain features 130, in accordance with some embodiments. In some embodiments, the silicide layers 164 are made of WSi, NiSi, TiSi and/or CoSi. In some embodiments, the formation of the silicide layers 164 includes depositing a metal material followed by one or more annealing processes. The semiconductive material (e.g., Si) from the source/drain features 130N and 130P reacts with the metal material to form the silicide layers 164, in accordance with some embodiments.

Afterward, one or more conductive materials for the contact plugs 162 are deposited to overfill the contact openings, in accordance with some embodiments. In some embodiments, one or more conductive materials are deposited using CVD, PVD, e-beam evaporation, ALD, electroplating (ECP), electroless deposition (ELD), another suitable method, or a combination thereof to overfill the contact openings. The one or more conductive materials over the upper surface of the second interlayer dielectric layer 160 are planarized using, for example, CMP. After the planarization process, the upper surfaces of the contact plugs 162, the upper surface of the second interlayer dielectric layer 160 are substantially coplanar, in accordance with some embodiments.

The contact plugs 162 may have a multilayer structure including, for example, liner layers, adhesive layers, barrier layers, seed layers, metal bulk layers, another suitable layer, or a combination thereof. For example, a barrier/adhesive layer (not shown) may optionally be deposited along the sidewalls and the bottom surfaces of the contact openings. The barrier/adhesive layer is used to prevent the metal from the subsequently formed metal material from diffusing into the dielectric and/or to improve adhesion between the subsequently formed metal material and the dielectric material. The barrier/adhesive layer may be made of tantalum (Ta), tantalum nitride (TaN), titanium (Ti), titanium nitride (TiN), cobalt tungsten (CoW), another suitable material, or a combination thereof.

In some embodiments, the metal bulk layer is formed using a selective deposition technique such as cyclic CVD process or ELD process, and it is not necessary to form a barrier/adhesive layer in the contact openings before depositing the metal bulk material. In some embodiments, the metal bulk layer is made of one or more conductive materials with low resistance and good gap-fill ability, for example, cobalt (Co), nickel (Ni), tungsten (W), titanium (Ti), tantalum (Ta), copper (Cu), rhodium (Rh), iridium (Ir), platinum (Pt), aluminum (Al), ruthenium (Ru), molybdenum (Mo), another suitable metal material, or a combination thereof.

It should be understood that the semiconductor structure 100 may undergo further CMOS processes to form various features over the semiconductor structure, such as a multilayer interconnect structure (e.g., contact plugs to final gate stacks, conductive vias, metal lines, inter metal dielectric layers, passivation layers, etc.).

Although the embodiments are discussed in the context of nanostructure transistors with fork-sheet structure, the aspect of the embodiments can be applied to other devices, e.g., planar transistors, FinFETs, GAA FETs, planar transistors, complementary FET, or another applicable device. For example, in some embodiments where the dielectric walls 110 are omitted, the lower fin elements 103P and 103N are surrounded by the isolation structure 116, and the four main surfaces of the nanostructures 108 are entirely wrapped by the final gate stack 146, thereby forming nanostructure transistors with GAA structure.

FIG. 3 is a modification of the semiconductor structure of FIG. 2J-5, in accordance with some embodiments of the disclosure. FIG. 3 illustrates a semiconductor structure 200 which is similar to the semiconductor structure 100 shown in FIG. 2J-5 except for the profile of the protruding portions 158P In the etching process for forming the cutting trenches 154, the etching rate of the gate spacer layers 124 may be lower than the etching rate of the final gate stacks 146, in accordance with some embodiments. The protruding portion 158P in the gate spacer layers 124 extends a third distance D7 toward the nanostructures 108 in the Y direction, in accordance with some embodiments. In some embodiments, the third distance D7 is less than the first distance D1. As a result, the protruding portions 158P may have stepped profile, as shown in FIG. 3, in accordance with some embodiments.

FIG. 4 is a modification of the semiconductor structure of FIG. 2J-5, in accordance with some embodiments of the disclosure. FIG. 4 illustrates a semiconductor structure 300 which is similar to the semiconductor structure 100 shown in FIG. 2J-5 except for the dimension of the protruding portions 158P.

In some embodiments, the edges 158E of the wider portions 158W of the gate cutting structures 158 are located within the area of the vertical portions of the contact etching stop layer 136 along the gate spacer layers 124. In the X direction, the protruding portions 158P of the gate cutting structure 158 have a dimension D4' which is greater than dimension D3 of the nanostructures 108, as shown in FIG. 4, in accordance with some embodiments.

FIG. 5 is a plan view illustrating a semiconductor structure 400, in accordance with some embodiments of the disclosure. The embodiments of FIG. 5 are similar to the embodiments of FIGS. 2J through 2J-5 except that the active region 104B_2 includes a wider segment and a narrower segment.

The active region 104 (e.g., 104B_2) includes a wider segment WS and a narrower segment NS and a transition segment TS connecting the wider segment WS to the narrower segment NS, in accordance with some embodiments. In some embodiments, the width W3 of the wider segment WS in the Y direction is greater than the width W4 of the narrower segment NS in the Y direction. The sidewall of the wider segment WS facing away from the gate cutting structure 158 is aligned with the sidewall of the narrower segment NS facing away from the gate cutting structure 158, while the sidewall of the wider segment WS facing the gate cutting structure 158 is not aligned with the sidewall of the narrower segment NS facing the gate cutting structure 158, in accordance with some embodiments.

In some embodiments, the dimension of the nanostructures 108 of the wider segment WS is wider than the dimension of the nanostructures 108 of the narrower segment NS in the Y direction. The wider segment WS and the narrower segment NS of the active region 104B_2 are used to form functional circuits with different performances (e.g., different on-state currents), in accordance with some embodiments. The fin cutting structure 140 (e.g., 140_1) cut through the transition segment TS of the active region 104B_2, in accordance with some embodiments.

The wider portion 158W of the gate cutting structure 158 keeps spaced apart from both the wider segment WS and the narrower segment NS of the active region 104B_2 by the spacing S2, as shown in FIG. 5, in accordance with some embodiments. The protruding portions 158P facing the narrower segment NS of the active region 104B_2 are denoted as 158P2, in accordance with some embodiments. The protruding portion 158P2 extends a fourth distance D8 from the sidewalls 158S (of the narrower portions 158N) of the gate cutting structure 158 toward the narrower segment NS of the active region 104B_2 in the Y direction. In some embodiments, the fourth distance D8 is greater than the first distance D1.

FIG. 6 is a plan view illustrating a semiconductor structure 500, in accordance with some embodiments of the disclosure. The embodiments of FIG. 6 are similar to the embodiments of FIGS. 2J through 2J-5 except that the active region 104B_2 includes a wider segment and a narrower segment.

The active region 104 (e.g., 104B_2) includes a wider segment WS and a narrower segment NS and a transition segment TS connecting the wider segment WS to the narrower segment NS, in accordance with some embodiments. In some embodiments, the width W3 of the narrower segment WS in the Y direction is less than the width W5 of the wider segment WS in the Y direction. The sidewall of the narrower segment NS facing away from the gate cutting structure 158 is aligned with the sidewall of the wider segment WS facing away from the gate cutting structure 158, while the sidewall of the narrower segment NS facing the gate cutting structure 158 is not aligned with the sidewall of the wider segment WS facing the gate cutting structure 158, in accordance with some embodiments. The fin cutting structure 140 (e.g., 140_1) cut through the transition segment TS of the active region 104B_2, in accordance with some embodiments.

In some embodiments where the lateral growth of the source/drain features may be not significant, the narrower portion 158N of the gate cutting structure 158 may be spaced apart from the wider segment WS of the active region 104B_2 by a smaller spacing S3 than the spacing S1 between the narrower portion 158N of the gate cutting structure 158 and the narrower segment NS of the active region 104B_2.

Furthermore, the portions of the gate cutting structure 158 extending into the final gate stacks 146 and the gate spacer layers 124 keep spaced apart from the wider segment WS the active region 104 by the spacing S2, and thus is indented from the sidewall 158S by a distance D9, in accordance with some embodiments. The portions of the gate cutting structure 158 extending into the final gate stacks 146 and the gate spacer layers 124 are referred to as indented portions 158I, in accordance with some embodiments. The width W6 of the indented portion 158I of the gate cutting structure 158 may be greater than, equal to, or less than the narrower portions 158N of the gate cutting structure 158, in accordance with some embodiments.

As described above, the aspect of the present disclosure is directed to a semiconductor structure including a gate cutting structure. The semiconductor structure 100 includes the gate cutting structure 158 in the gate stack 146 and the first interlayer dielectric layer 138. The distance S2 between the active region 104 and the portion 158W of the gate cutting structure 158 in the gate stack 146 is less than the distance S1 between the active region 104 and the portion 158N of the gate cutting structure 158 in the first interlayer dielectric layer 138. Therefore, the risk of damage to the source/drain features 130 in the etching process for forming the gate cutting structure 158 may reduce, while the parasitic capacitance between the gate stack 146 and the contact plug 162 may reduce. Therefore, the performance and the manufacturing yield of the resulting semiconductor device may increase.

Embodiments of a semiconductor structure and a method for forming the semiconductor structure are provided. The method may include etching the gate stack and the interlayer dielectric layer to form a cutting trench. The cutting trench includes a first portion extending into the gate stack and a second portion extending into the interlayer dielectric layer, and the first width of the first portion of the cutting trench is wider than the second width of the second portion of the cutting trench in a direction parallel to the longitudinal axis of the gate stack. Therefore, the risk of damage to the source/drain features may reduce, while the parasitic capacitance may reduce. Therefore, the performance and the manufacturing yield of the resulting semiconductor device may increase.

In some embodiments, a method for forming a semiconductor structure is provided. The method includes forming a first active region, forming an interlayer dielectric layer over a source/drain region of the first active region, forming a gate stack to surround the channel region of the first active region, and etching the gate stack and the interlayer dielectric layer to form a cutting trench. The cutting trench includes a first portion extending into the gate stack and a second portion extending into the interlayer dielectric layer. A first width of the first portion of the cutting trench is different than a second width of the second portion of the cutting trench in a direction parallel to a longitudinal axis of the gate stack. The method also includes forming a gate cutting structure in the cutting trench.

In some embodiments, a method for forming a semiconductor structure is provided. The method includes forming a first plurality of nanostructures over a lower fin element, forming a source/drain feature over the lower fin element to abut the plurality of nanostructures, forming an interlayer dielectric layer over the source/drain feature, forming a first gate stack to surround the first plurality of nanostructures, forming a spacer layer between the first gate stack and the source/drain feature, and forming a gate cutting structure in the spacer layer, the first gate stack and the interlayer dielectric layer. The gate cutting structure includes a first protruding portion which extends a first distance from a first sidewall of the gate cutting structure toward the first plurality of nanostructures in a first direction that is parallel to a longitudinal axis of the first gate stack.

In some embodiments, a semiconductor structure is provided. The semiconductor structure includes a first active region extending in a first direction, an interlayer dielectric layer over the source/drain region of the first active region, a first gate stack extending in a second direction perpendicular to the first direction and surrounding a channel region of the first active region, and a gate cutting structure in the first gate stack and the interlayer dielectric layer. In a plan view, a first distance between the first active region and a first portion of the gate cutting structure in the first gate stack is less than a second distance between the first active region and a second portion of the gate cutting structure in the interlayer dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a first active region;
   forming an interlayer dielectric layer over a source/drain region of the first active region;
   forming a gate stack to surround the channel region of the first active region;
   etching the gate stack and the interlayer dielectric layer to form a cutting trench, wherein the cutting trench includes a first portion extending into the gate stack and a second portion extending into the interlayer dielectric layer, and a first width of the first portion of the cutting trench is different than a second width of the second portion of the cutting trench in a direction parallel to a longitudinal axis of the gate stack; and
   forming a gate cutting structure in the cutting trench.

2. The method for forming the semiconductor structure as claimed in claim 1, wherein the gate stack is cut into two segments which are electrically isolated from each other by the gate cutting structure.

3. The method for forming the semiconductor structure as claimed in claim 1, wherein the first width is wider than the second width.

4. The method for forming the semiconductor structure as claimed in claim 1, wherein the first active region includes a lower fin element, and the channel region of the first active region includes a plurality of nanostructures vertically stacked over the lower fin element.

5. The method for forming the semiconductor structure as claimed in claim 4, further comprising:
   forming an isolation structure adjacent to the lower fin element of the first active region, wherein the gate stack and the interlayer dielectric layer are formed over the isolation structure, and the cutting trench extends into the isolation structure.

6. The method for forming the semiconductor structure as claimed in claim 1, further comprising:
   forming a second active region;
   forming a dummy gate structure across the first active region and the second active region;
   replacing a first portion of the dummy gate structure and a portion of the second active region with a fin cutting structure; and
   replacing a second portion of the dummy gate structure with the gate stack, wherein the cutting trench exposes the fin cutting structure.

7. The method for forming the semiconductor structure as claimed in claim 6, wherein in a plan view, the first portion of the cutting trench includes a first protruding portion extending a first distance toward the first active region and a second protruding portion extending a second distance toward the second active region, and the second distance is longer than the first distance.

8. The method for forming the semiconductor structure as claimed in claim 7, wherein the second protruding portion is wider than the first protruding portion.

9. A method for forming a semiconductor structure, comprising:
   forming a first plurality of nanostructures over a lower fin element;

forming a source/drain feature over the lower fin element to abut the first plurality of nanostructures;

forming an interlayer dielectric layer over the source/drain feature;

forming a first gate stack to surround the first plurality of nanostructures;

forming a spacer layer between the first gate stack and the source/drain feature; and forming a gate cutting structure in the spacer layer, the first gate stack and the interlayer dielectric layer, wherein the gate cutting structure includes a first protruding portion which extends a first distance from a first sidewall of the gate cutting structure toward the first plurality of nanostructures in a first direction that is parallel to a longitudinal axis of the first gate stack.

10. The method for forming the semiconductor structure as claimed in claim 9, wherein the gate cutting structure includes a second protruding portion which extends a second distance from the first sidewall of the gate cutting structure toward the first plurality of nanostructures in the first direction, and the second distance is shorter than the first distance.

11. The method for forming the semiconductor structure as claimed in claim 9, wherein the first plurality of nanostructures has a first dimension in a second direction that is parallel to a longitudinal axis of the lower fin element, the first protruding portion of the gate cutting structure has a second dimension in the second direction, and the second dimension is less than the first dimension.

12. The method for forming the semiconductor structure as claimed in claim 11, wherein the first gate stack has a third dimension in the second direction, and the second dimension is greater than the third dimension.

13. The method for forming the semiconductor structure as claimed in claim 9, further comprising:

forming a second plurality of nanostructures over the lower fin element, wherein in the first direction, a first dimension of the first plurality of nanostructures is smaller than a second dimension of the second plurality of nanostructures; and forming a second gate stack to surround the second plurality of nanostructures.

14. The method for forming the semiconductor structure as claimed in claim 13, wherein the first sidewall of the gate cutting structure includes a portion facing the second plurality of nanostructures, and the portion of the first sidewall of the gate cutting structure is indented from the first sidewall of the gate cutting structure in the first direction.

15. A method for forming a semiconductor structure, comprising:

forming a first plurality of channel layers over a first fin element;

forming a second plurality of channel layers over a second fin element;

forming a first source/drain feature over the first fin element;

forming a second source/drain feature over the second fin element;

forming a gate stack across the first fin element and the second fin element, wherein the gate stack wraps around the first plurality of channel layers and the second plurality of channel layers; and forming a gate cutting structure through the gate stack, wherein:

the gate cutting structure has a first edge between the first plurality of channel layers and the second plurality of channel layers and a second edge between the first source/drain feature and the second source/drain feature, and in a top view, the first edge is offset from the second edge by a distance, and the first edge is connected to the second edge through a third edge of the gate cutting structure.

16. The method for forming the semiconductor structure as claimed in claim 15, wherein the first edge and the second edge extend along a first direction, and the third edge extends along a second direction that is perpendicular to the first direction.

17. The method for forming the semiconductor structure as claimed in claim 16, wherein the first fin element and the second fin element extend lengthwise along the first direction, and the gate stack extends lengthwise along the second direction.

18. The method for forming the semiconductor structure as claimed in claim 16, wherein the first plurality of channel layers has a first dimension along the first direction, the first edge has a second dimension along the first direction, and the second dimension is less than the first dimension.

19. The method for forming the semiconductor structure as claimed in claim 15, further comprising:

forming an isolation structure between the first fin element and the second fin element, wherein the gate cutting structure vertically extends into the isolation structure.

20. The method for forming the semiconductor structure as claimed in claim 15, further comprising:

forming a contact plug on the first source/drain feature and the second source/drain feature, wherein the contact plug is located directly above the gate cutting structure.

* * * * *